United States Patent
Maeda

[19]

[11] Patent Number: 6,110,290
[45] Date of Patent: Aug. 29, 2000

[54] METHOD FOR EPITAXIAL GROWTH AND APPARATUS FOR EPITAXIAL GROWTH

[75] Inventor: Kazuo Maeda, Tokyo, Japan

[73] Assignee: Semiconductor Process Laboratory Co., Japan

[21] Appl. No.: 09/012,452

[22] Filed: Jan. 23, 1998

Related U.S. Application Data

[62] Division of application No. 08/506,039, Jul. 24, 1995, Pat. No. 5,769,942.

[30] Foreign Application Priority Data

Sep. 29, 1994 [JP] Japan .................................. 6-235621

[51] Int. Cl.⁷ .................................................. C23C 14/00
[52] U.S. Cl. ............................ 118/725; 118/726; 118/729
[58] Field of Search ..................... 118/725, 726, 118/729

[56] References Cited

U.S. PATENT DOCUMENTS

| | | | |
|---|---|---|---|
| 3,047,438 | 7/1962 | Marinace | 437/90 |
| 4,100,879 | 7/1978 | Goldin | 118/725 |
| 4,171,996 | 10/1979 | Maslov | 117/91 |
| 4,314,873 | 2/1982 | Wieder | 117/91 |
| 4,464,222 | 8/1984 | Gutsche | 117/29 |
| 4,468,278 | 8/1984 | Cadoret | 117/86 |
| 4,507,169 | 3/1985 | Nogami | 117/91 |
| 5,275,687 | 1/1994 | Choquette | 117/98 |

FOREIGN PATENT DOCUMENTS

| | | |
|---|---|---|
| 58135633 | 8/1963 | Japan . |
| 43-5568 | 2/1968 | Japan . |
| 43-21367 | 9/1968 | Japan . |
| 4321367 | 9/1969 | Japan . |
| 50-13239 | 5/1975 | Japan . |
| 56-1525 | 1/1981 | Japan . |
| 58-169907 | 10/1983 | Japan . |
| 1184815 | 7/1989 | Japan . |
| 1207920 | 8/1989 | Japan . |
| 1228169 | 9/1989 | Japan . |
| 3139824 | 6/1991 | Japan . |

Primary Examiner—Richard Bueker
Attorney, Agent, or Firm—Lorusso & Loud

[57] ABSTRACT

This invention concerns a method for epitaxial growth by the use of a so-called heterogeneous reaction and includes disposing a source material in a first area of a horizontal chamber, disposing a growth substrate in a second area thereof, heating the first area thereby keeping the source material at a first temperature, heating the second area thereby keeping the growth substrate at a second temperature, lower than the first temperature, introducing a reaction gas into the chamber thereby causing the reaction gas to react with the source material and depositing the resultant reaction product on the growth substrate and consequently obtaining formation of a film by epitaxial growth.

5 Claims, 16 Drawing Sheets

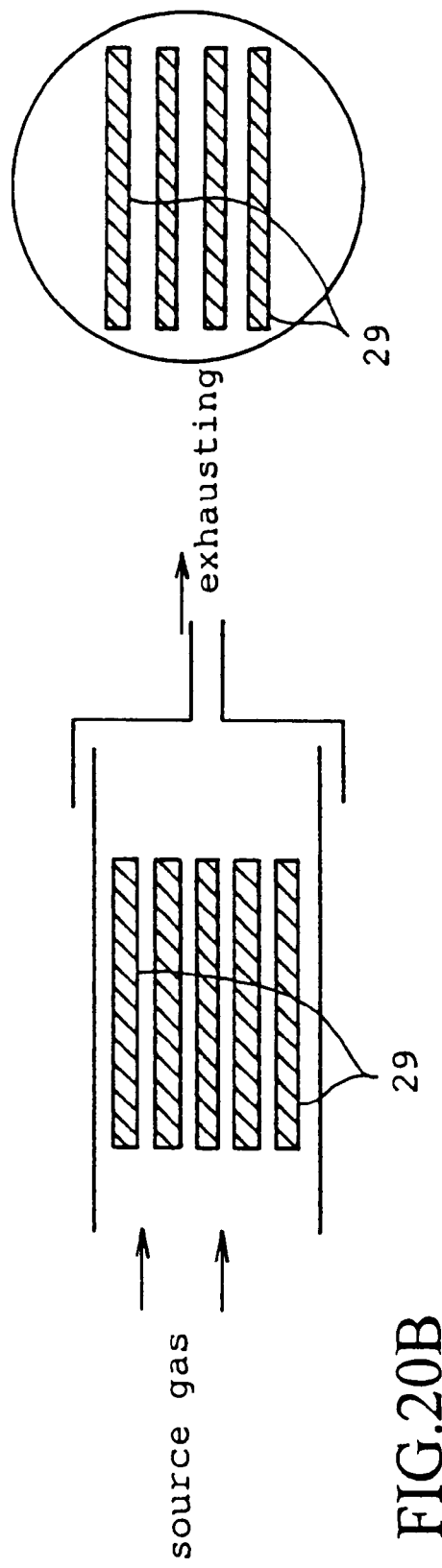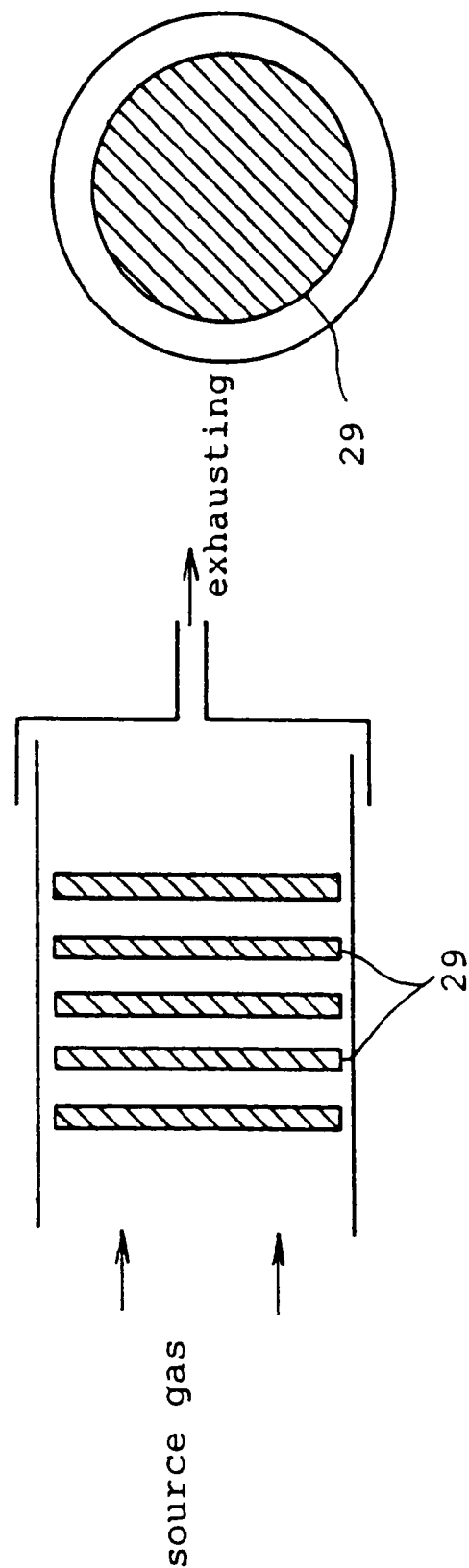

METHOD FOR EPITAXIAL GROWTH AND APPARATUS FOR EPITAXIAL GROWTH

CROSS-REFERENCE TO RELATED APPLICATION

This application is a division of U.S. Ser. No. 08/506,039, filed Jul. 24, 1995 and entitled "METHOD FOR EPITAXIAL GROWTH AND APPARATUS FOR EPITAXIAL GROWTH", now U.S. Pat. No. 5,769,942.

BACKGROUND OF THE INVENTION

1. Field of the Invention

This invention relates to a method for epitaxial growth and an apparatus for the epitaxial growth. More particularly, it relates to a method for epitaxial growth by means of a so-called heterogeneous reaction and an apparatus therefor.

2. Description of the Prior Art

Heretofore, the method for forming, on a semiconducting substrate of a single crystal, e.g. silicon, a thin film of a semiconductor single crystal, a species the same as or different from the substrate, has extensively utilized epitaxial growth for the production of a semiconductor device.

Control of the film-forming conditions is an extremely important factor from the viewpoint of forming a single crystal. The method has been known to be one of the most difficult of all the techniques that are available for the production of such semiconductor devices such as the LSI.

JP-B-43-21,367 discloses a primitive method for epitaxial growth by a heterogeneous reaction. This method of growth requires the temperature of a source substrate to be higher than that of the growth substrate for ensuring effective mass transfer. As shown in FIG. 1, therefore, a silicon substrate as a source substrate 3 is placed on a source substrate holder 2 which is provided with a heater and a silicon substrate as a substrate 5 for growth is opposed to the source substrate 3 across a prescribed gap.

Then, by causing a gas composed of bromine and a hydrogen compound thereof to flow through the gap between the silicon substrates 3 and 5, the source silicon substrate 3 is etched and, at the same time, the reaction product resulting from the etching is deposited on the silicon substrate 5 for growth.

At this time, the temperature of the substrate 5 for growth is maintained within a prescribed range lest the rate of growth should decline. For this reason, the two substrates are brought as close to each other as possible. If too close to each other, the result will be precipitation thereon of the reaction product from the etching. Therefore, they must be kept a proper distance from each other. A spacer 4 is interposed between the two substrates 3 and 5 for the purpose of keeping them at the proper distance.

After the growth in a given cycle is completed and before the growth in the subsequent cycle is started, the distance between the two substrates may require readjustment. It is necessary in this case that the spacer which has shortened be replaced or that the source substrate which has worn thin be replaced.

Though the method of growth mentioned above has been utilized for elucidating the fundamental mechanism of epitaxial growth, it has never been reduced to commercial operation because it cannot be adapted for mass production. This circumstance has led to the development of the CVD method in which a reaction product originating solely in a reaction gas is caused to be deposited on a substrate for growth. This CVD method has been the leader of all the existent methods for epitaxial growth. The plasma-enhanced CVD method and the light-assisted CVD method have been proposed as specific versions of the CVD method and the use of a compound such as the disilane ($Si_2H_6$) for the CVD method has been also proposed. None of these methods has yet reached the level of practicability. At present, the pyrolytic CVD method is used as the most practical version of the CVD method.

The pyrolytic CVD method basically comprises heating a silicon substrate, for example, in an atmosphere of hydrogen at an elevated temperature of not less than 1000° C., supplying a reaction gas such as $SiH_4$, $SiH_2Cl_2$, or $SiHCl_3$ in combination with hydrogen onto a substrate for growth thereby causing such reactions as are shown below to occur on the surface of the substrate for growth and inducing the formation of a silicon film. This formation of the film must satisfy the following film-forming conditions:

(1) The reaction gas must be heated to a temperature higher than the reaction temperature.

(2) Neither a natural oxide film nor any defiling substance can be present on the surface of the substrate.

(3) The Si atoms formed by the decomposition of the reaction gas and deposited on the substrate should possess thorough mobility to permit formation of a single crystal seed.

For the purpose of removing the natural oxide film from the surface of the substrate, the practice of subjecting the substrate to a high-temperature treatment in an atmosphere of hydrogen is now resorted to.

The apparatuses for epitaxial growth which are applicable to the method for growth mentioned above are classified by the shape of reaction chamber as the vertical type, the horizontal type, the barrel type, the cluster type, or other. They are also classified by the method of heating as the resistance heating type, the high-frequency heating type, the lamp heating type, or other. By the method of wafer treatment, they are classified as the sheet feed type, the batch type, or other. In conformity with the trend of semiconductor devices toward increasingly high densification (number of components per chip) and integration, the wafers of recent manufacture predominantly have a diameter of 200 mm. It is expected that the age of wafers with a diameter of 300 mm will arrive in the near future. In this connection, the problems which confront the feasibilization of an apparatus for epitaxial growth or a method for epitaxial growth which can be adapted for the expected increase of diameter of wafers are now under study in search of a solution.

Adaption for the prospective increase in the diameter of the wafers, poses the following problems for the CVD apparatus described above:

(1) Consequent increase in size of the apparatus, (2) Extreme difficulty encountered in consequence of the increase in size of the apparatus in attaining control of the pattern of gas flow and adjustment of the geometric shape of reactor and consequent possibility of degrading the uniformity of film thickness and film quality within and between the individual wafers, (3) Huge consumption of hydrogen gas for improved uniformity of film thickness and film quality and rise of energy cost of heating and ready dispersion of temperature distribution particularly in the case of a batch apparatus, (4) Degradation of throughput in the case of an apparatus of the sheet feed type, and (5) Rise of production cost per wafer.

Since the apparatus under discussion uses a gas such as $SiH_4$, $SiH_2Cl_2$, $SiHCl_3$, or $SiCl_4$ as the reaction gas, it requires full attention from the viewpoint of ensuring safety and preventing corrosion.

With a view to coping with the various problems confronted by the CVD method mentioned above, the primitive method for epitaxial growth which resorts to the heterogeneous reaction has come to attract renewed attention. To adapt this method for practical utility and mass production, it is necessary that the following matters be duly considered.

(1) To keep the difference of temperature between the two substrates constant, the method requires the distance between the substrates to be exactly adjusted. Particularly after forming a film on a given wafer is completed and before forming a film on a subsequent wafer is started, the distance between the substrates must be readjusted. Thus, the process of production is complicated.

(2) The method requires as a source material therefor at least a flat and smooth substrate having the same surface area as the substrate for growth. This requirement poses a serious obstacle to the use of a wafer of a large diameter as the substrate for growth.

(3) The work of simultaneously performing a film-forming treatment on a plurality of substrates for growth entails great difficulty.

(4) The method does not permit use of a blocklike substance as the source material.

SUMMARY OF THE INVENTION

An object of this invention is to provide an apparatus for epitaxial growth and a method for epitaxial growth which permit manufacture of wafers of an increased diameter with augmented adaptability for mass production and which enhance uniformity of film thickness and film quality of the produced wafers, reduction in the consumption of energy and the cost of production, and increased safety of operation.

This invention is a method for epitaxial growth using a so-called heterogeneous reaction. To be specific, a silicon substrate, for example, is placed as a source substrate on the high temperature side and a silicon substrate, for example, is placed as a substrate for growth on the low temperature side inside a chamber and a halogen gas such as iodine is introduced into the chamber, as is well known. As a result, reactions such as the following occur:

$$Si + 2I_2 \rightarrow SiI_4$$

$$SiI_4 + Si \rightarrow 2SiI_2$$

to produce $SiI_2$ on the source substrate. This $SiI_2$ moves onto the substrate for growth on the low temperature side and induces a reaction such as is shown below.

$$2SiI_2 \rightarrow Si + SiI_4$$

The above Si reaction product is deposited on the growth substrate.

Incidentally, the reaction product originating in the source substrate is ultimately deposited on the substrate for growth and this transfer of the reaction product results in the removal of the surface layer of the source substrate by etching. As a result, the surface of the source substrate recedes over a distance roughly equalling the thickness of the reaction product deposited on the growth substrate. When the subsequent growth substrate for deposition of the reaction product is set at the same position as the previous substrate for growth, therefore, the distance between the source substrate and the newly set growth substrate differs from that between the source substrate and the previous substrate for growth. Particularly when the film produced by the deposition of the reaction product acquires a large thickness, the distance between the opposed substrates increases so much as to render it difficult to keep the prescribed temperature difference constant.

The apparatus of this invention for epitaxial growth is provided with a source substrate holder, with which a first heating means is associated, and a first moving means for vertically moving a holder for the growth substrate which is opposed to the source substrate holder.

Alternatively, it is provided with a source substrate holder having a third heating means, a holder for a substrate for growth which is opposed to the source substrate holder, and third moving means for vertically moving the source substrate holder.

The method for epitaxial growth of the present invention, therefore, enables the substrate for growth opposite the source substrate to assume a temperature lower than that of the source substrate and give rise to a prescribed temperature difference relative to the source substrate by keeping the source substrate heated and meanwhile vertically moving the source substrate or the substrate for growth thereby adjusting the distance between the two opposed substrates. The same adjustment of the temperature difference as mentioned above can be otherwise accomplished by heating the substrate for growth separately of the source substrate instead of adjusting the distance.

Since the distance intervening between the source substrate and the substrate for growth and the temperature difference of the substrate for growth relative to the source substrate can be easily adjusted as described above, the formation of film can be continuously carried out on different growth substrates. The formation of film can be expedited owing to the use of the heterogeneous reaction. As a consequence, the throughput of the apparatus can be improved and the adaptability of the method for mass production is enhanced.

Further, by the use of the means for vertical movement mentioned above, the distance between the source substrate and the substrate for growth can be increased wide enough to preclude the occurrence of the heterogeneous reaction, while hydrogen is introduced through the gas inlet to effect the treatment with hydrogen prior to the deposition of the reaction product. In addition, the film formation can be immediately started in the same chamber as that which has been used for the treatment with hydrogen after completion of this treatment. The formation of a film, therefore, can be started on a clean surface, which fact contributes to improvement the quality of the film eventually produced. The treatment with hydrogen can be carried out while the temperature of the source substrate is kept practically equal to that of the substrate for growth. By substantially equalizing the temperatures of these two substrates, the mass transfer can be controlled.

Besides, the provision of the heating means for the holder of the substrate for growth results in increasing the uniformity of temperature of the substrate for growth because this heating means directly heats the whole of this substrate. Further, the apparatus is not affected by the shape of reactor, the flow rate of gas, or other factors because it utilizes the heterogeneous reaction and requires utilization of the opposed surfaces of the two substrates. As a result, the apparatus promotes enhancement of the uniformity of film thickness and film quality and adapts itself for an increase in the diameter of wafers to be manufactured.

The apparatus also allows the substrate for growth to be opposed uniformly to the entire surface of a larger source substrate because it is provided with fourth moving means for moving at least either of the source substrate or the substrate for growth in a direction parallel to the surface of growth of the deposited reaction product. The heterogeneous reaction, therefore, can be made to proceed uniformly over the entire surface of the source substrate. The result is a flat surface of the source substrate after completion of the reaction.

The apparatus is capable of forming a film at a high rate and obtaining a fully satisfactory throughput even in the sheet feed type operation and, therefore, affording a saving in the energy consumption. Besides, the apparatus contributes to lower the cost of production because it is not required to use hydrogen gas in a large amount.

The apparatus is also safe because it uses, as the reaction gas, a halogen gas such as, for example, chlorine, bromine, iodine, hydrogen chloride, hydrogen bromide, or hydrogen iodide.

The apparatus, in addition to being provided on the source substrate side with the heating means, may be provided with heating means on the growth substrate side. In this case, no moving means is required to be provided for the purpose of establishing the prescribed temperature difference between the source substrate and the substrate for growth.

Even when separate heating means are provided on the source substrate side and on the growth substrate side, it is permissible to provide moving means for at least one of the is source substrate and the substrate for growth. As a result, the prescribed temperature difference can be retained between the source substrate and the growth substrate while the two substrates are kept at the prescribed distance from each other.

In another embodiment, the method and apparatus of this invention for epitaxial growth utilize a procedure which comprises disposing a source material in a first region of a horizontal film-forming chamber, disposing a substrate for growth in a second region thereof, heating the two regions independently of each other, thereby maintaining the temperature on the source material side higher than that on the growth substrate side, and introducing a reaction gas into the chamber, with the result that the source material in the first region will be caused to react with the reaction gas and form a reaction product containing the atoms of the source material and the reaction product will be decomposed and deposited on the substrate for growth which is kept heated to a temperature lower than the source material, and the mass transfer of the source material will induce the formation of a film by epitaxial growth.

Unlike the method and the apparatus for epitaxial growth mentioned above, this embodiment causes the two substrates to be heated separately of each other instead of utilizing the control of the distance between the two substrates. This embodiment, therefore, effects a simplification of the process of production because it requires only disposition of the source material and the substrate for growth respectively in the first and second regions instead of necessitating accurate adjustment of the distance therebetween. Moreover, this latter embodiment allows use of a source material in the shape of a block and also permits a wafer of a large diameter or a plurality of such wafers to be disposed as the substrate for growth in the second region independent of the surface area of the source material. As a result, the method of this latter embodiment has excellent adaptability for mass production and permits economic production of a film by epitaxial growth.

Incidentally, when silicon substances are used as materials for the source material and the substrate for growth, elemental halogen gases, hydrogen halide gases, or mixtures of these gases with hydrogen gas or an inert gas can be used as the reaction gas. The substrates to be used effectively herein may be in the form of a single crystal sheet, a polycrystalline sheet, or an amorphous sheet. It is allowable to have the source material and the substrate for growth formed severally of different substances and to induce formation of a film of a different substance on the substrate for growth. It is also permissible to use a quartz glass sheet as the material of the substrate for growth. As noted above, the method of this invention is widely adaptable for the growth of an epitaxial film and the apparatus of this invention offers effective means therefor.

An epitaxial film possessing the prescribed resistivity can be formed by causing the source material to contain impurities at a prescribed concentration and consequently enabling the impurities to be conveyed by mass transfer together with the source material onto the substrate for growth. Further, the growth of the epitaxial film can be accelerated by carrying out the film formation while keeping the interior of the chamber under a reduced pressure.

BRIEF DESCRIPTION OF THE DRAWING

FIG. 20A is a front view and a corresponding side view illustrating one arrangement of silicon wafers in a chamber in the method for growth according to the sixth embodiment of this invention and FIG. 20B is a front view and a corresponding side view illustrating another arrangement of silicon wafers in the chamber in the method for growth according to the sixth embodiment of this invention.

DESCRIPTION OF THE PREFERRED EMBODIMENT

Now, embodiments of this invention will be described below with reference to the accompanying drawings.

Figure 2:
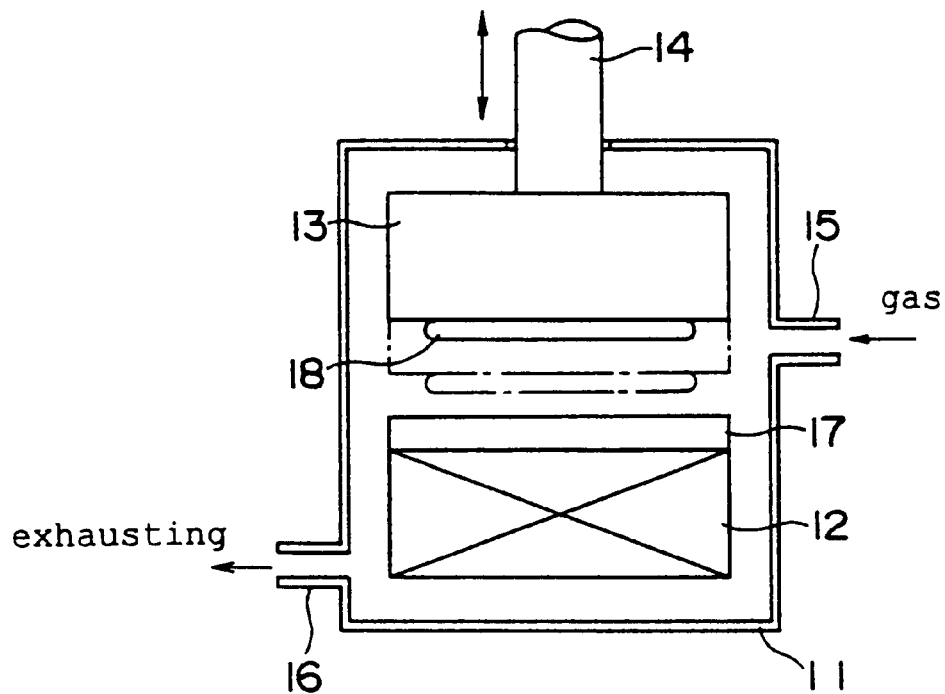
FIG. 2 is a schematic cross section of an apparatus for epitaxial growth according to the first embodiment of this invention.

(1) Embodiments of Apparatus for Epitaxial Growth According to This Invention (a) First Embodiment FIG. 2 is a side view showing the construction of an apparatus for epitaxial growth according to the first embodiment of this invention.

In FIG. 2, 11 indicates a chamber for operating under reduced pressure and 12 a source substrate holder disposed inside the chamber 11 and equipped with a heater (the first heating means). In advance of the formation of a film, a source substrate 17 is mounted on the source substrate holder 12.

A holder 13 for a growth substrate is disposed in the chamber 11 opposed to the source substrate holder 12. This holder 13 is fixed on a vertically movable shaft 14 (the first moving means) by which the growth holder 13 is vertically moved. In preparation for the formation of a film, a growth substrate 18 is mounted on the substrate holder 13.

Figure 6:
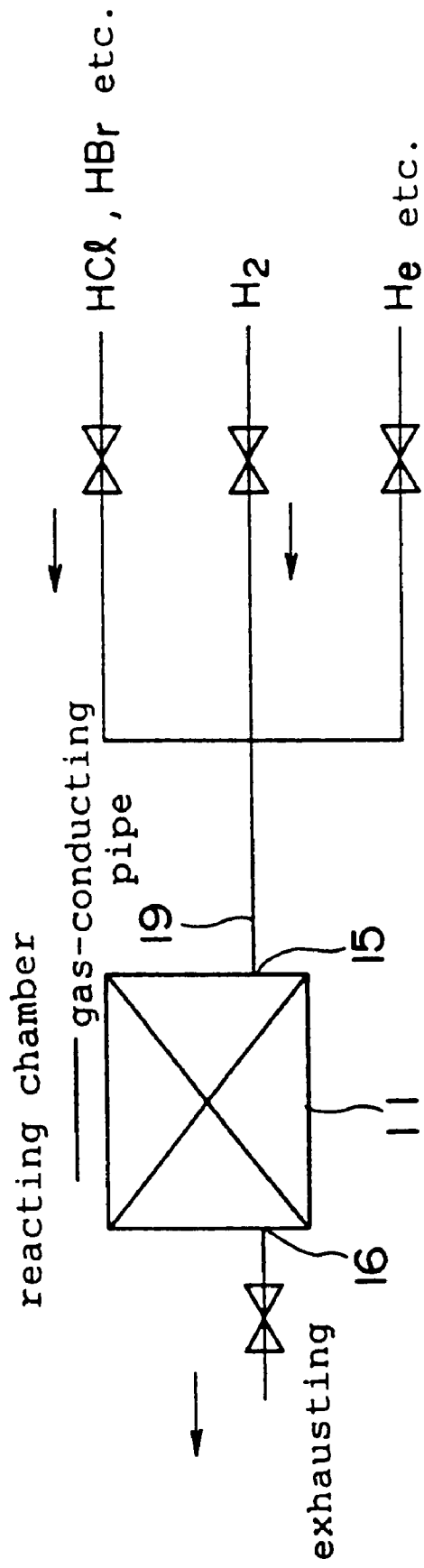
FIG. 6 is a schematic diagram illustrating connection of reaction gas lines to the apparatus for epitaxial growth of this invention.

A gas inlet 15 allows for introducing a reaction gas and other gases into the chamber 11. To the gas inlet 15 is connected a gas pipe 19 for feeding a halogen gas (HCl, HBr, etc.), a hydrogen gas ($H_2$), and helium gas (He), as shown in FIG. 6.

A gas outlet 16 is for reducing the inner pressure of the chamber 11 and, at the same time, discharging a spent reaction gas.

One example of the method for epitaxial growth by the use of the apparatus for epitaxial growth described above will now be described. Preparatorily to the formation of a film, the substrate 18 for growth is pulled upward and subjected to a pretreatment with hydrogen. At the outset of the film formation, the substrate 18 for growth is moved downward and brought to a stop at a prescribed distance from the source substrate 17. As a result, the heat emanating from the source substrate 17 is transmitted through the medium of the gap to the substrate 18 for growth and utilized for keeping the substrate 18 for growth at a prescribed temperature difference relative to the source substrate 17. After the film formation, the substrate 18 for growth is pulled upward again, given an aftertreatment, and then taken out of the chamber 11.

The apparatus for epitaxial growth according to the first embodiment, as described above, comprises the source substrate holder 12 which is provided with a heater and the vertically moving shaft 14 for vertically moving the growth substrate holder 13 disposed opposite the source substrate holder 12.

By heating the source substrate 17 and vertically moving the growth substrate 18, thereby adjusting the distance of the growth substrate 18 from the source substrate 17, the growth substrate 18 for growth opposed to the source substrate 17 is heated to a temperature lower than the temperature of the source substrate 17 to thereby establish a prescribed temperature difference relative to the source substrate 17.

Epitaxial growth can be continuously carried out on different growth substrates 18 because the distance between the source substrate 17 and the growth substrate 18 and the temperature difference between the growth substrate 18 and the source substance 17 can be easily adjusted as described above. Further, the film formation can be expedited owing to the use of the heterogeneous reaction. As a result, the throughput of the apparatus and the adaptability of the method for mass production can be improved.

Though the apparatus for epitaxial growth according to the first embodiment has been described above as having the source substrate holder 12 alone provided with a heater, the holder 13 for the growth substrate may be provided with a heater (the second heating means) instead. Since the whole of the growth substrate 18 can be directly heated, as a consequence, the temperature thereof can be made more uniform. In addition, operation of the apparatus is not affected by such factors as the shape of reactor and the flow rate of gas because it operates with a heterogeneous reaction at the opposed surfaces of the two substrates. As a result, the uniformity of film thickness and film quality are improved and an increase in the diameter of the wafers to be manufactured can be accommodated. Further, though the first the embodiment represents a case of having the growth substrate holder disposed on the upper side and the source substrate holder on the lower side, the apparatus under discussion may have the growth substrate holder disposed on the lower side and the source substrate holder on the upper side instead.

While the first embodiment is depicted as having the growth substrate holder 13 alone connected to the vertically moving shaft 14 and, as a result, allowing it exclusively to be vertically moved, the apparatus may additionally have the source substrate holder 12 connected to a vertically moving shaft so that the two holders both will be vertically moved.

(b) Second Embodiment

Figure 3:
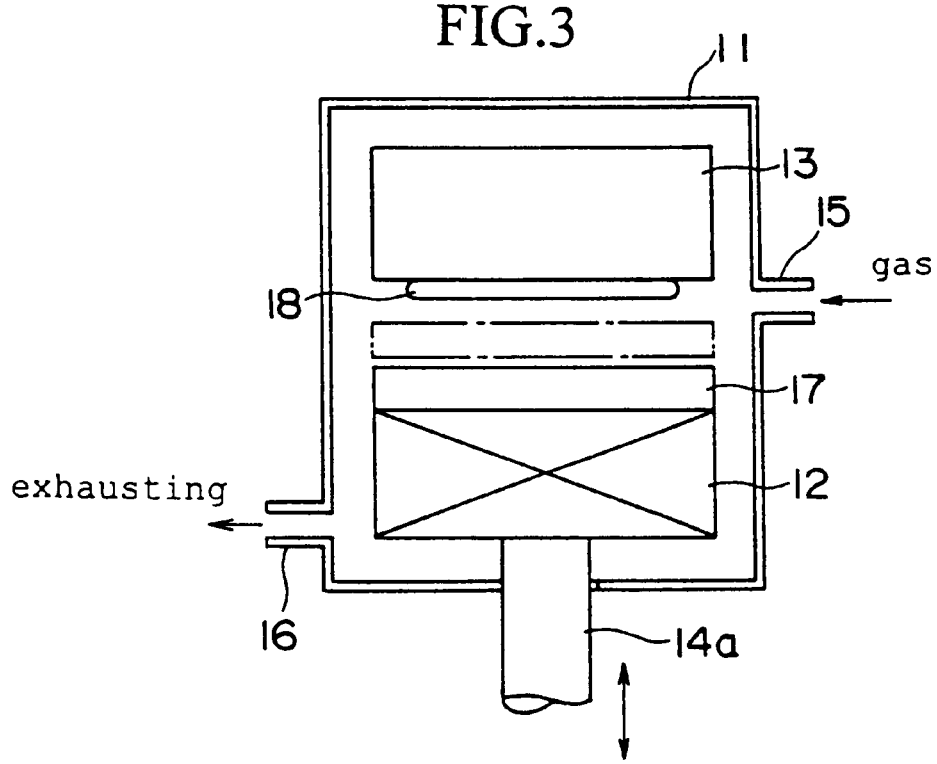
FIG. 3 is a schematic cross section of an apparatus for epitaxial growth according to the second embodiment of this invention.

FIG. 3 is a side view showing the construction of an apparatus for epitaxial growth according to the second embodiment of this invention.

Figure 1:
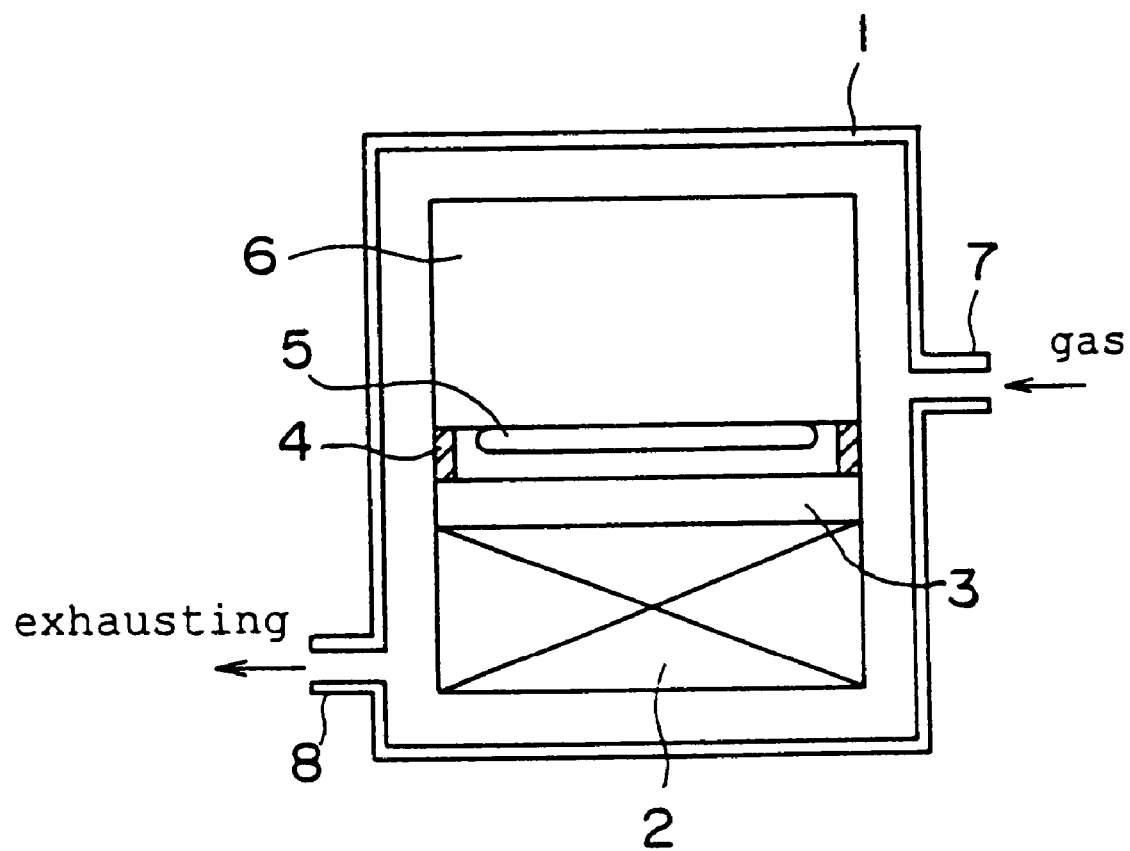
FIG. 1 is a schematic cross section of a prior art apparatus for epitaxial growth.

The second embodiment is different from the first embodiment in that only the source substrate holder 12 is equipped with a heater (the third heating means) connected to a vertically movable shaft (the third moving means) 14a. In the diagram, like parts found in FIG. 2 are denoted by like reference numerals shown in FIG. 1.

Thus, in the second embodiment, the source substrate holder 13 is vertically moved by the vertically moving shaft 14.

In preparation for the film formation, the growth substrate 18 is mounted on the growth substrate holder 13 and the source substrate 17 is mounted on the source substrate holder 12. Prior to the film formation, the source substrate 17 is pulled downward to widen the distance between the source substrate 17 and the growth substrate 18 and to allow the pretreatment as with hydrogen. Then, at the outset of the film formation, the source substrate 17 is moved upward and brought to a stop at a prescribed distance from the growth substrate 18. As a result, the heat emanating from the source substrate 17 is transmitted through the medium of the gap to the growth substrate 18 to maintain a prescribed temperature difference between the two substrates. After the film formation, the source substrate 17 is pulled downward again and the growth substrate 18, after an aftertreatment and the like, is taken out of the chamber.

The apparatus for epitaxial growth according to the second embodiment, as described above, comprises the source substrate holder 12 equipped with a heater, the growth substrate holder 13 opposed thereto, and the vertically moving shaft 14a for vertically moving the source substrate holder 12.

By heating the source substrate 17 and vertically moving the source substrate 17, thereby adjusting the distance of the growth substrate 18 from the source substrate 17, therefore, the growth substrate 18 opposed to the source substrate 17 is heated to a temperature lower than the temperature of the source substrate 17, thereby establishing a prescribed temperature difference relative to the source substrate 17.

The epitaxial growth can be continuously carried out on different growth substrates 18 because the distance between the source substrate 17 and the growth substrate 18 and the temperature difference between the growth substrate 18 and the source substrate 17 can be easily adjusted as described above. Further, the film formation can be expedited owing to the use of the heterogeneous reaction. As a result, the throughput of the apparatus can be improved and the adaptability of the method for mass production can be enhanced.

Though the apparatus for epitaxial growth according to the second embodiment is depicted as having the source substrate holder 12 exclusively provided with a heater, it may have the growth substrate holder 13 provided with a heater (the fourth heating means).

(c) Third Embodiment

Figure 4:
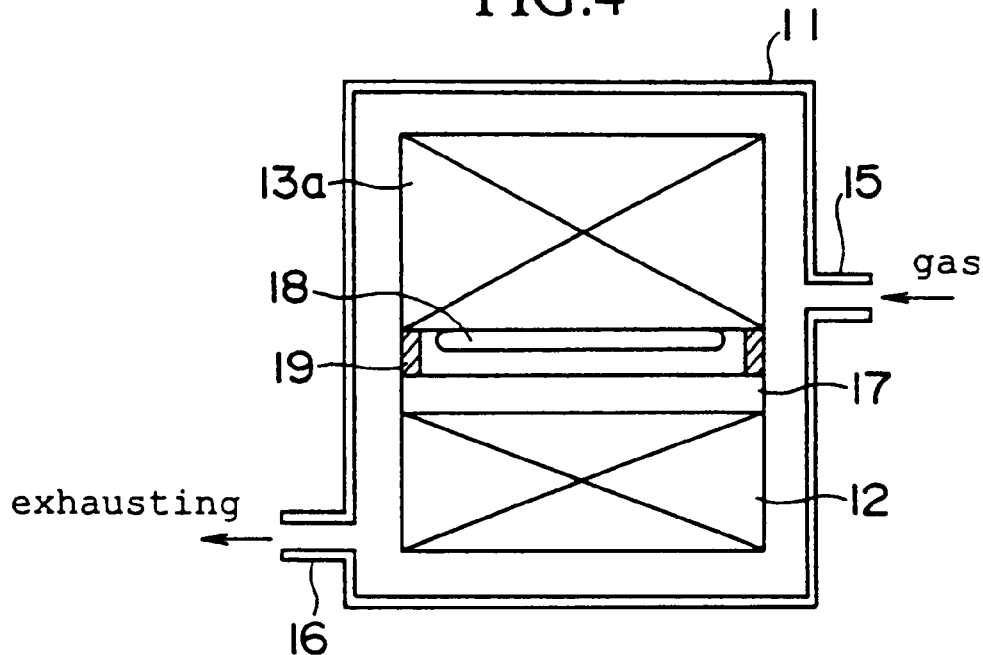
FIG. 4 is a schematic cross section of an apparatus for epitaxial growth according to the third embodiment of this invention.

FIG. 4 is a side view showing the apparatus for epitaxial growth according to the third embodiment of this invention.

The third embodiment is different from the first and the second embodiment in having the source substrate holder 12 and the growth substrate holder 13 each provided with a heater and, at the same time, having these substrates fixed separated by a prescribed distance by the interposition of a spacer 19 therebetween. In FIG. 4, like parts found in FIG. 2 are denoted by the same reference numerals.

In the third embodiment, prior to the film formation, the growth substrate 18 for growth is mounted on the growth substrate holder 13a and the source substrate 17 is mounted on the source substrate holder 12. Then, they are opposed to each other across a gap of a prescribed distance through the medium of the spacer 19.

During the film formation, the source substrate 17 and the growth substrate 18 are respectively heated by the heater of the source substrate holder 12 and the heater of the growth substrate holder 13a so that the source substrate 17 will assume a temperature higher than the temperature of the growth substrate 18 and so that a prescribed temperature difference is established.

After the film formation, the growth substrate 18 is taken out of the chamber.

When a new growth substrate is subsequently set in place for film formation, the same spacer 19 is interposed. At this time, the distance between the source substrate 17 and the growth substrate is different from that existent previously because the surface layer of the source substrate 17 has been removed by etching during the previous film formation and, in this connection, creating the possibility that the prescribed temperature difference between the two substrates will not be retained. The independent heaters mentioned above, however, can be adjusted so as to satisfy the temperature conditions.

The apparatus for epitaxial growth according to the third embodiment attains the same adjustment of temperature difference as in the first and the second embodiment by heating the growth substrate 18 separately from the source substrate 17 as described above.

The film formation, therefore, can be continuously carried out on different growth substrates because the temperature difference between the growth substrate 18 and the source substrate 17 can be easily adjusted as described above. Further, the film formation can be expedited because it is implemented by means of the heterogeneous reaction.

(d) Fourth Embodiment

Figure 5:
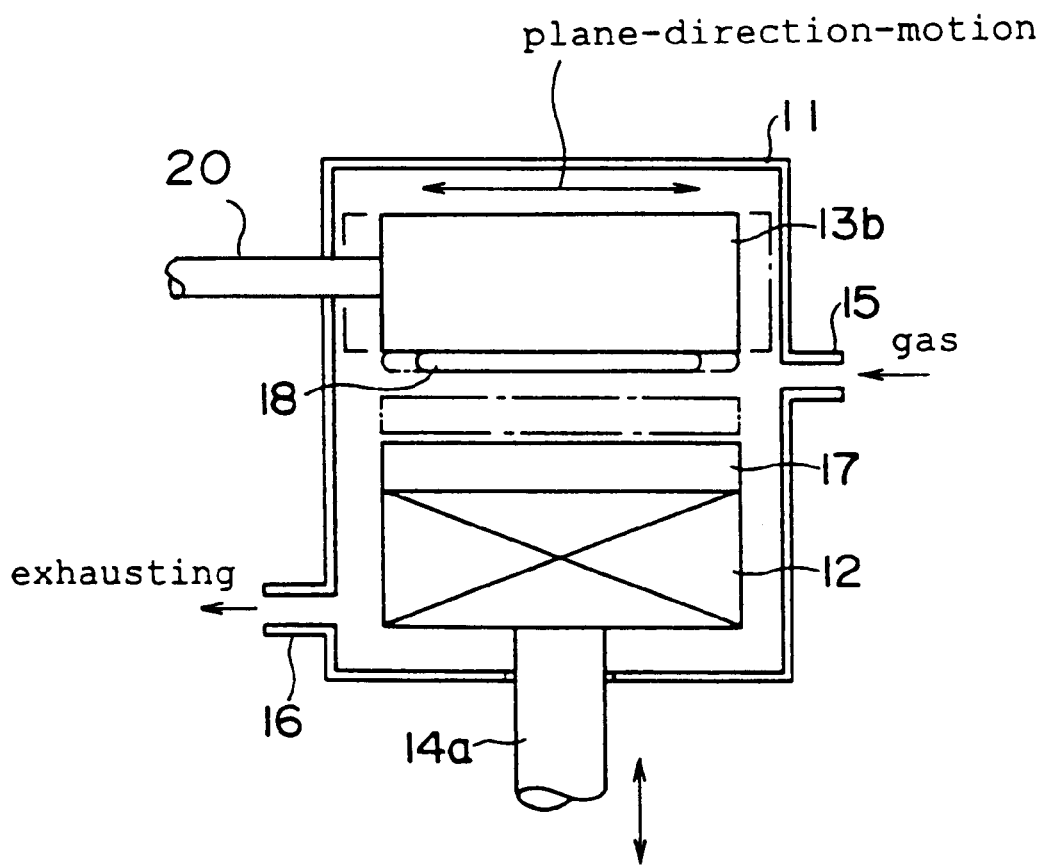
FIG. 5 is a schematic cross section of an apparatus for epitaxial growth according to the fourth embodiment of this invention.

FIG. 5 is a side view of an apparatus for epitaxial growth according to the fourth embodiment of this invention.

The fourth embodiment is different from the second embodiment in having growth substrate holder 13b connected to planar moving means 20 (the fourth moving means) and, therefore, enabled to move in a direction parallel to the surface of the film during the process of growth. Linear moving means 14a serves to adjust the gap between substrates 17 and 18. In FIG. 5, like parts found in FIG. 3 are denoted by the same reference numerals used in FIG. 3.

Figure 7A:
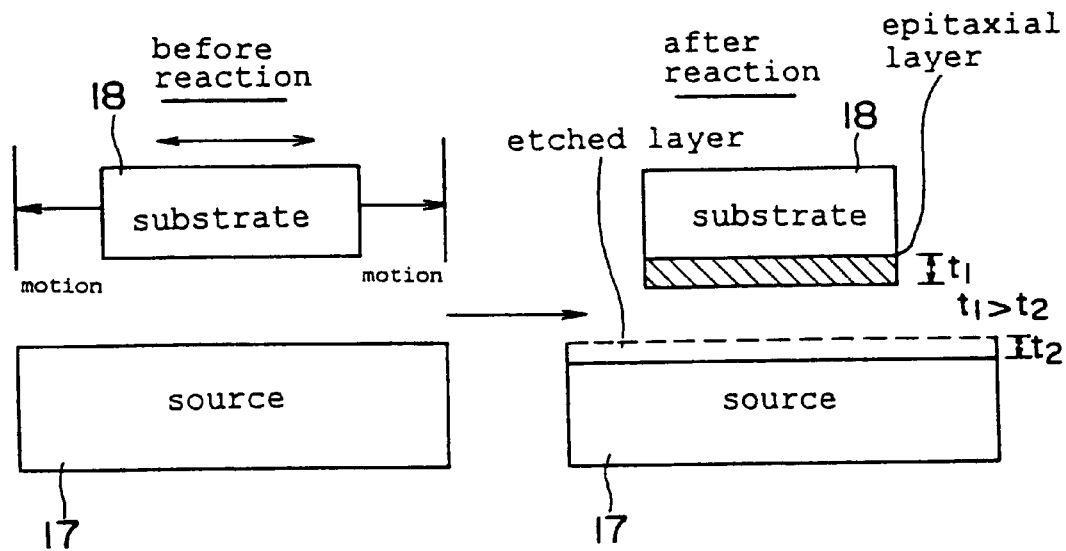
FIG. 7A and FIG. 7B are schematic cross sections illustrating a method for epitaxial growth by the use of the apparatus according to the fourth embodiment of this invention.

The epitaxial growth by the use of this apparatus for epitaxial growth is implemented as follows. During the course of the film formation, the entire surface of the source substrate 17 is uniformly etched and the flatness of the surface of the source substrate 17 is maintained by moving the growth substrate 18 in a direction parallel to the surface of the film being grown and allowing it to be evenly opposed to the surface of the source substrate 17 as shown in FIG. 7A.

Figure 7B:
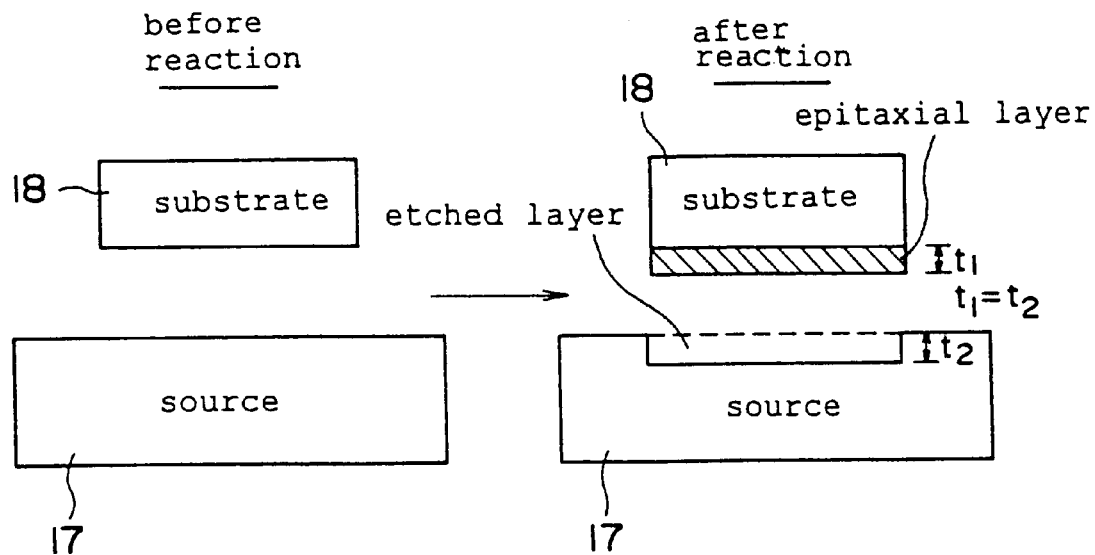

Incidentally, in the apparatus for epitaxial growth according to the second embodiment, since the source substrate 17 and the substrate 18 for growth are fixed at respectively prescribed positions and are not allowed to move in a planar direction parallel to each other, the source substrate 17 is etched mainly on the portion of the surface thereof which is opposed to the growth substrate 18 as shown in FIG. 7B (right side).

The apparatus for epitaxial growth according to the fourth embodiment mentioned above enables the growth substrate 18 to be opposed evenly to the entire surface of the source substrate 17 by planar moving means for moving the growth substrate 18 in a direction parallel to the surface of growth of itself. Therefore, it allows the heterogeneous reaction to occur evenly on the entire surface of the source substrate 17. As a result, the source substrate 17 will still have a flat surface after the reaction.

Though the apparatus for epitaxial growth according to the fourth embodiment described above has the planar moving means connected exclusively to the source substrate holder 12, it may have the planar moving means connected only to the growth substrate holder 13 or to both of the two substrate holders.

Figure 8A:
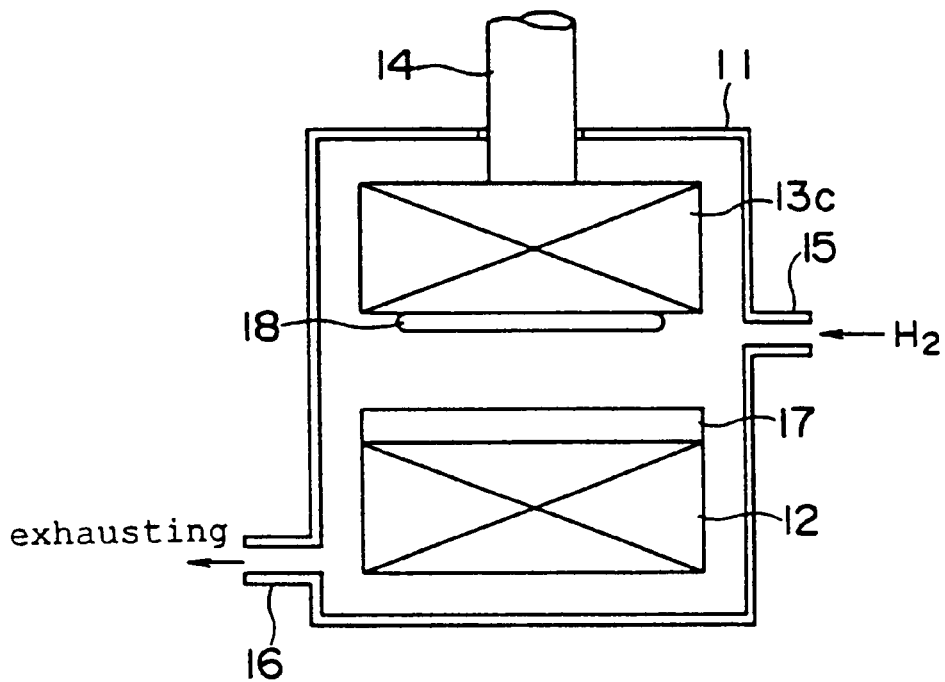
FIGS. 8A through 8C are a series of schematic cross sections illustrating a method for epitaxial growth according to the fifth embodiment of this invention.

(2) Explanation of Epitaxial Growth According to the Fifth Embodiment of the Invention Now, the method for epitaxial growth according to the fifth embodiment of this invention will be described below with reference to FIGS. 8A through 8C.

The apparatus to be used herein in implementing the method for epitaxial growth has each of the source substrate holder 12 and a growth substrate holder 13c provided with a heater, the vertically moving shaft 14 connected to the growth substrate holder 13c, and the planar moving means 12 connected to the source substrate holder 12. In the diagram, like parts found in FIG. 2 are denoted by the same reference numerals used in FIG. 2.

First, the internal pressure of the chamber 11 is reduced. The growth substrate holder 13c is subsequently pulled upward and brought to a stop at a point remote from the original position as shown in FIG. 8A. A silicon sheet is mounted as the growth substrate 18 on the substrate holder 13c and, at the same time, another silicon sheet is mounted as the source substrate 17 on the source substrate holder 12.

Then, with the heater of the growth substrate holder 13c, the growth substrate 18 is heated to and kept at a temperature of about 1000° C. Subsequently, hydrogen gas is introduced through the gas inlet 15 into the chamber 11 until the internal pressure of the chamber 11 reaches 1 Torr, which pressure is retained thereafter.

The apparatus is left standing in the ensuant state for about one hour. During this time, extraneous substances such as natural oxide film are caused to react with hydrogen gas and removed from the surface of the growth substrate 18.

Figure 8B:
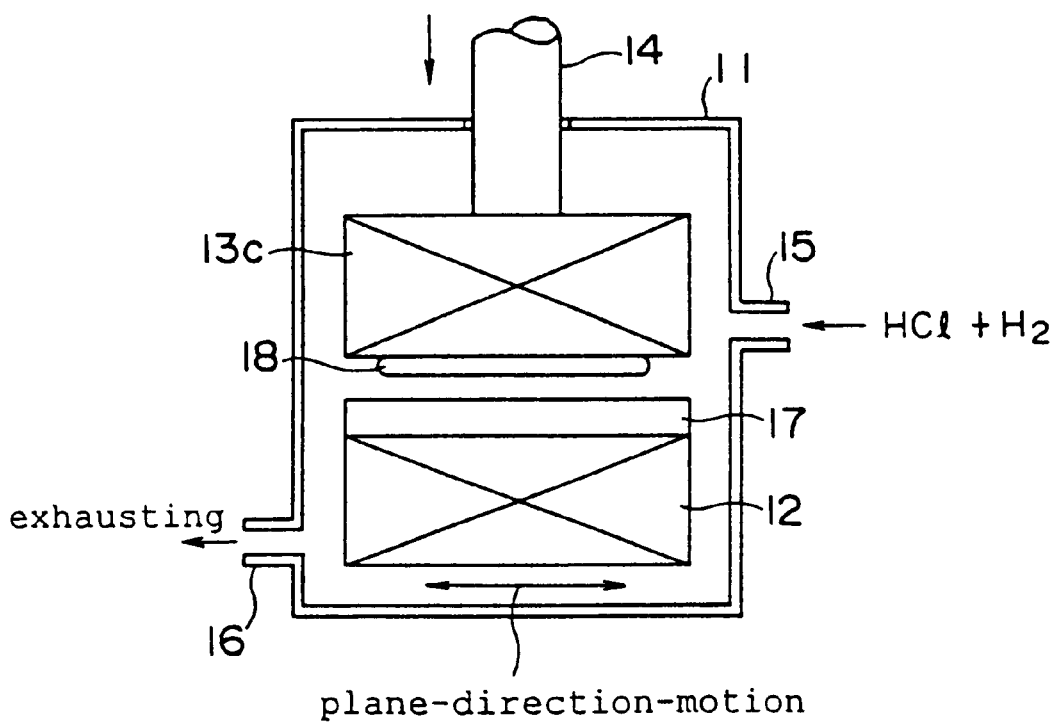
Figure 8C:
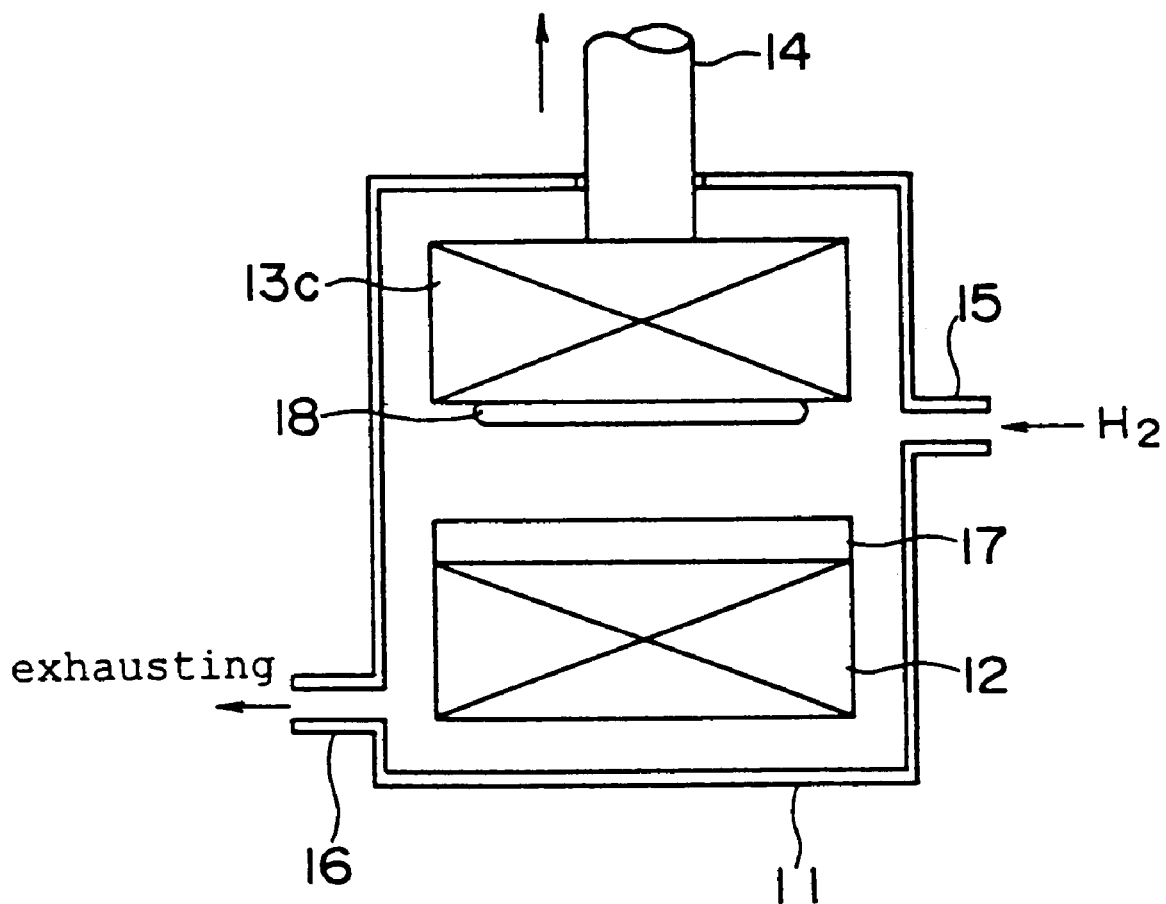

Then, with the internal pressure of the chamber 11 maintained, the source substrate 17 is heated with the heater of the source substrate holder 12 and, at the same time, the growth substrate 18 is moved down by the vertically moving shaft 14 to bring the source substrate 17 and the growth substrate 18 into position proximate each other and to eventually establish a prescribed distance (gap) therebetween as shown in FIG. 8B. The source substrate 17 is heated to a temperature higher than the temperature of the growth substrate 18 for growth thereby establishing a prescribed temperature difference. Incidentally, the gap must be so fixed that the temperature in the gap will not fall below the temperature of the reaction. When the equipment keeps the gap under a reduced pressure, this gap may exceed even 10 mm. Where the heater is provided only on the source substrate 17 side, it is necessary to satisfy the requirement that the temperature of the growth substrate 18 be selected to fall in a prescribed range in addition to the aforementioned condition.

Subsequently, hydrogen chloride (a halogen-containing gas) is introduced, in addition to the hydrogen gas, through the gas inlet 15. Further, the source substrate holder 12 is moved by the planar moving means in a direction parallel to the surface of the film being grown so that the entire surface of the source substrate 17 may be evenly exposed in opposition to the surface of the growth substrate 18.

As a result, the etching occurs mainly on the source substrate 17 which has a higher temperature and proceeds uniformly throughout the entire surface of the source substrate 17. The reaction product arising from the etching is deposited on the growth substrate 18 which has a lower temperature.

Figure 9:
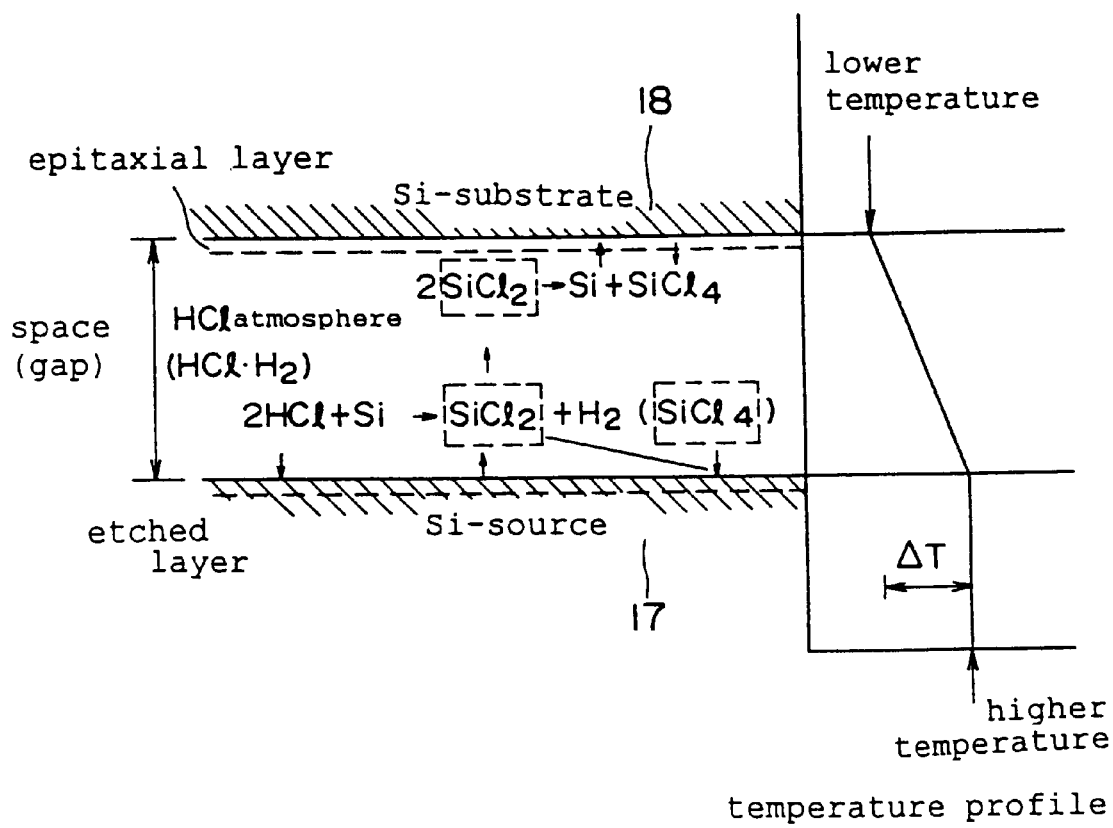
FIG. 9 is an explanatory diagram depicting a heterogeneous reaction which is the principle of growth in the method for epitaxial growth of this invention.

FIG. 9 depicts the manner in which the reaction for the growth of film takes place. Specifically, on the source substrate 17 side having a higher temperature, a reaction such as shown below proceeds to form $SiCl_2$.

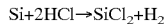

$$Si + 2HCl \rightarrow SiCl_2 + H_2$$

The reaction product, $SiCl_2$, migrates onto the growth substrate 18 which is at a lower temperature and is caused to undergo such a reaction as shown below. The Si consequently obtained is deposited on the growth substrate 18.

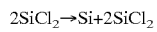

$$2SiCl_2 \rightarrow Si + 2SiCl_2$$

After the preceding reaction has lasted for a prescribed length of time, the silicon film grows to a prescribed thickness on the substrate 18.

Then, the introduction of the halogen-containing gas is stopped while that of hydrogen gas alone is continued. Subsequently, the growth substrate holder 13 is pulled upward and then left in the elevated position as shown in FIG. 8C and the growth substrate 18 is meanwhile subjected to heat treatment. The growth substrate 18 is subsequently taken out of the chamber.

The method for epitaxial growth according to the fifth embodiment enables the film formation to be continued on different growth substrates 18 because it allows, not only the distance of opposition between the source substrate 17 and the growth substrate 18, but also the temperature difference between the growth substrate 18 and the source substrate 17 to be easily adjusted as described above. Further, it is capable of expediting film formation owing to the utilization of the heterogeneous reaction. As a result, this method contributes to improvement of the throughput of the apparatus and augments the adaptability of the method for mass production.

After the distance between the source substrate 17 and the growth substrate 18 has been widened by vertically moving the growth substrate 18 to an extent short of inducing the heterogeneous reaction prior to the commencement of deposition of the reaction product, hydrogen is introduced through the gas inlet to effect a treatment with hydrogen. As a result, the epitaxial growth can be carried out on a clean surface and the produced film product has high quality.

Further, by providing a heater for the growth substrate holder 13c, thereby enabling the growth substrate 18 to be directly heated therewith, the uniformity of temperature of the substrate 18 is enhanced. In addition, the method is not affected by such factors as the shape of reactor and the flow rate of gas because it operates by dint of the heterogeneous reaction at the opposed surfaces of the two substrates. As a result, it contributes to improvement in the uniformity of film thickness and film quality and allows an increase in the diameter of wafers to be manufactured.

Since the source substrate 17 is enabled to move in a direction parallel to the surface of the film being grown, the growth substrate 18 can be evenly opposed to the entire surface of the source substrate 17. The heterogeneous reaction, therefore, can be caused to proceed uniformly on the entire surface of the source substrate 17.

Further, since the method operates with the heterogeneous reaction, it is capable of forming a film at a high rate and obtaining a fully satisfactory throughput even in the sheet feed type operation and consequently affording a saving in energy consumption. Besides, the method contributes to lower the cost of production because it is not required to use hydrogen gas in a large amount.

Moreover, the method is safe because it uses a gas containing hydrogen chloride as the reaction gas.

The reaction gas may be another halogen-containing gas such as, for example, chlorine, bromine, iodine, hydrogen bromide, or hydrogen iodide, in the place of hydrogen chloride. It is allowable to use silicon tetrachloride ($SiCl_4$), trichloro-silane ($SiHCl_3$), or dichlorosilane ($SiH_2Cl_2$) as occasion demands. Various combinations such as, for example, $H_2/SiCl_4$, $H_2SiHCl_4$, $H_2/Br_2$, $H_2/HCl$, $He/SiCl_4$, $He/Br_2$, or $He/HCl$ are also usable.

Though silicon sheets are generally used for the source substrate 17 and the growth substrate 18, germanium sheets and compound semiconductor substrates may be used instead.

The halogen gas is used as mixed with hydrogen gas. Helium, nitrogen, or argon may be used in the place of hydrogen gas in the mixture. It is also permissible to use a 100% halogen gas or hydrogen halide gas which is not diluted with such gases as are mentioned above.

The halogen gas may be derived from a solid or a liquid source.

The pretreatment with hydrogen is carried out while the source substrate 17 and the growth substrate 18 are kept separated with a widened gap. The treatment with hydrogen may be carried out with the source substrate 17 and the growth substrate 18 heated independently of each other and kept at practically equal temperatures. This treatment results in repressing the mass transfer without reference to the magnitude of the gap between the source substrate 17 and the growth substrate 18 and, consequently, obviates the necessity for adjusting the gap.

Though the treatment with hydrogen and the formation of film are generally carried out under a reduced pressure, they may both be carried out under normal pressure or one of them may be performed under normal pressure or a reduced pressure with the other step at a different pressure.

As the pretreatment, a heat treatment is generally carried out in an atmosphere of hydrogen. Optionally, a vapor treatment using hydrofluoric acid may be used instead.

The films which were grown on the growth substrates 18 by the method described above with the following conditions of film growth varied:

(a) Kind of gas, (b) Temperature of source substrate, (c) Temperature of growth substrate, and (d) Gap were examined with respect to the following factors:

(a) Growth rate and (b) Relation between resistivity of source substrate resistivity of grown film.

In the examination which will be described hereinbelow, the apparatus for epitaxial growth shown in FIG. 2 was used and the film formation was carried out under normal pressure. The temperature difference between the source substrate 17 and the growth substrate 18 was kept in the range of from 20 to 60° C. At this time, the gap was roughly 100 $\mu$m. The results of the examination will be explained below.

Figure 10:
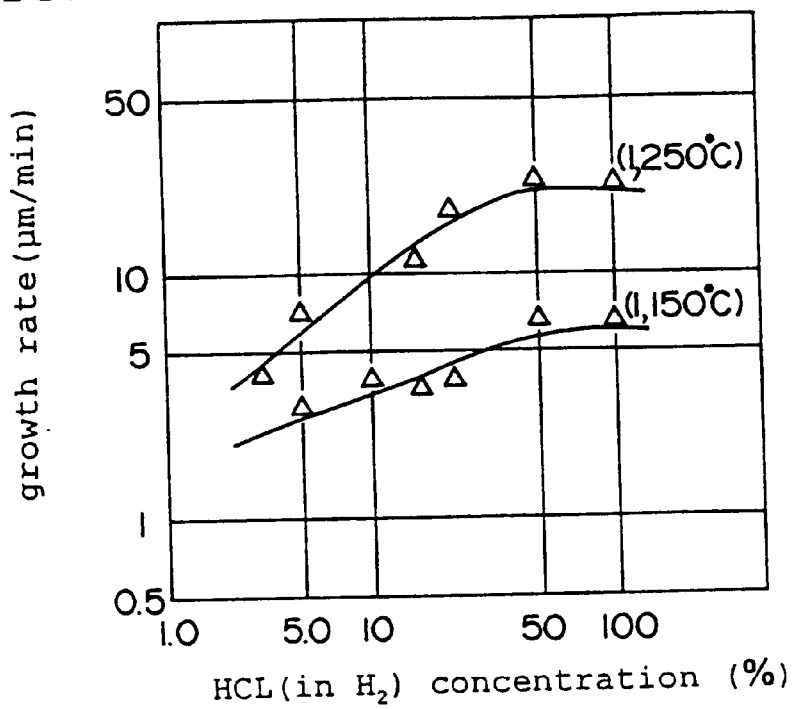
FIG. 10 is a graph of the hydrogen chloride content in the reaction gas versus the rate of growth obtained with the method for epitaxial growth of this invention.

FIG. 10 is a graph showing the relationship between the hydrogen chloride (HCl) concentration in hydrogen ($H_2$) and the rate of growth. In FIG. 10, the horizontal axis is the logarithmic scale of the hydrogen chloride concentration (%) in hydrogen and the vertical axis the logarithmic scale of the rate of growth ($\mu$m/min.).

A mixed gas of HCl+$H_2$ was used as the reaction gas, with the hydrogen chloride content thereof varied in the range of from 2 to 100$\mu$m. These varying mixed gases were examined with respect to two kinds of source substrate 17 at temperatures of 1150° C. and 1250° C.

The test results shown in FIG. 10 indicate that the rate of growth increased in proportion to rise of the source substrate temperature. In the test at 1150° C., the growth rate, which was about 2 $\mu$m/min. when the hydrogen chloride content was 2%, increased in proportion to increase of the hydrogen chloride content, reached about 6 $\mu$m/min. when the hydrogen chloride content rose to 50%, and remained substantially constant thereafter until the hydrogen chloride content reached 100%. In the test at 1250° C., the growth rate, which was about 4 $\mu$m/min. when the hydrogen chloride content was 2%, increased in proportion to increase of the hydrogen chloride content, reached about 25 $\mu$m/min. when the hydrogen chloride content rose to 50%, and remained substantially constant thereafter until the hydrogen chloride content reached 100%.

Figure 11:
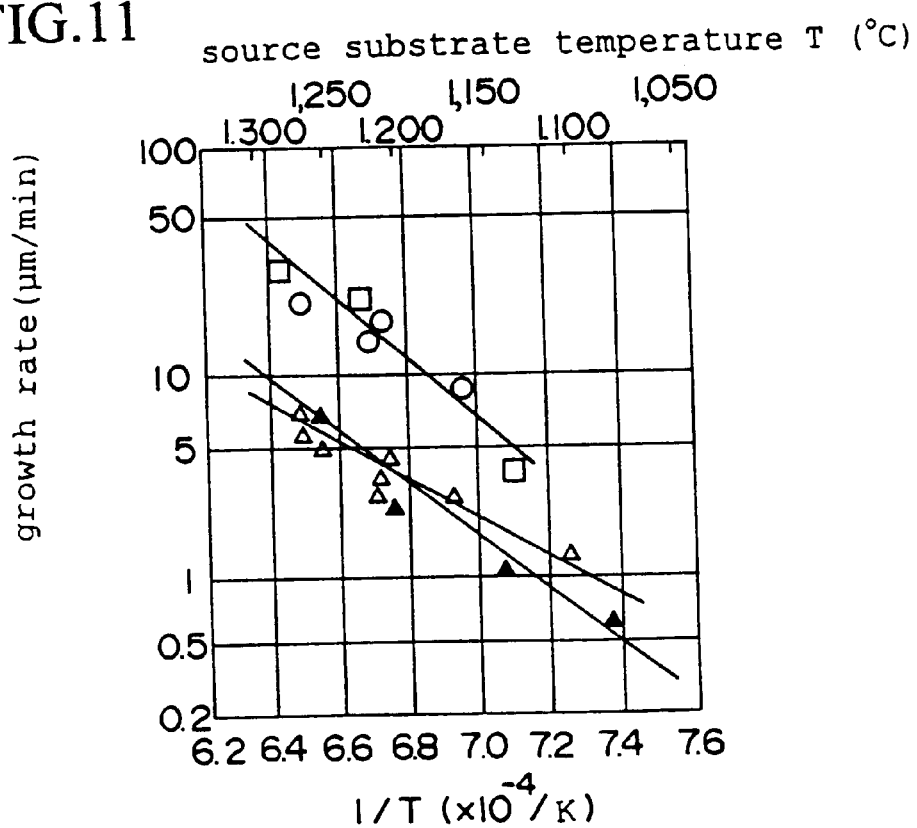
FIG. 11 is a graph of the temperature of the substrate for growth versus the rate of growth obtained by the method of epitaxial growth of this invention.

FIG. 11 is a graph showing the relationship between the temperature of growth and the rate of growth. In the diagram the horizontal axis is the linear scale of the reciprocal of the temperature of the source substrate 17 ($\times 10^{-4}$/K) and the vertical axis the logarithmic scale of the rate of growth ($\mu$m/min.).

A mixed gas of HCl+$H_2$ or HCl+He was used as the reaction gas and the temperature of the source substrate 17 was varied in the range of from 1050° C. to 1300° C. The examination was carried out with respect to three HCl contents, 100, 50, and 3.3%, (in $H_2$) and one HCl content, 3%, (in He). In the diagram, an open square mark represents a sample having a HCl content of 100% (in $H_2$), an open circular mark a sample having a HCl content of 50% (in $H_2$), an open triangular mark a sample having a HCl content of 3.3% (in $H_2$), and a solid triangular mark a sample having a HCl content of 3% (in He)

The test results shown in FIG. 11 indicate that the rate of growth was inversely proportional to the reciprocal of the temperature of the source substrate 17. This means that the rate of growth increased in proportion to a rise in the temperature. The curves obtained for the samples with HCl contents of 100% and 50% (in $H_2$) practically conformed; the rates of growth were about 7 $\mu$m/min. at 1150° C. and about 50 $\mu$m/min. at 1300° C. In the case of the samples having a HCl content of 3.3% (in $H_2$), the rate of growth was about 1.5 $\mu$m/min. at 1100° C. and about 6 $\mu$m/min. at 1250° C. In the case of the samples having a HCl content of 3% (in He), the rate of growth was 0.7 $\mu$m/min. at 1080° C. and 7 $\mu$m/min. at 1250° C.

Figure 12:
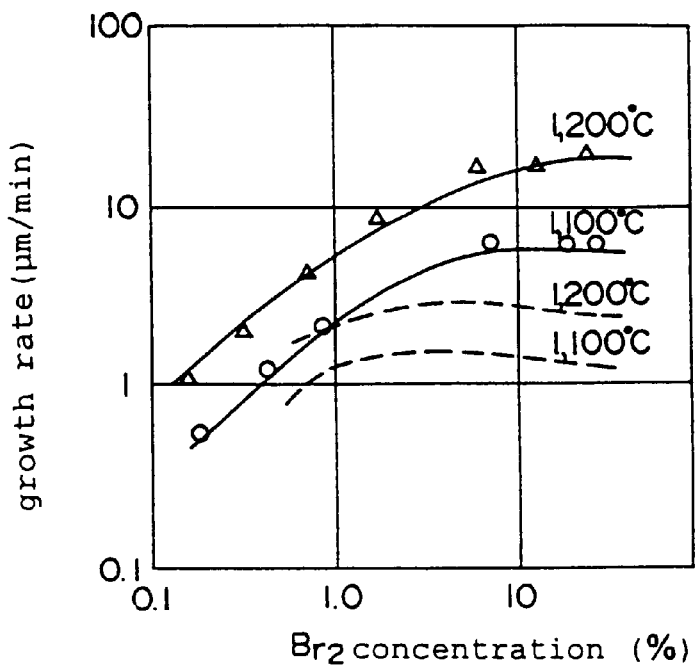
FIG. 12 is a graph of the bromine content of the reaction gas versus the rate of growth obtained by the method of this invention.

FIG. 12 is a graph showing the relationship between the bromine ($Br_2$) concentration in hydrogen or helium and the rate of growth. In the diagram, the horizontal axis is the logarithmic scale of the bromine concentration (%) in hydrogen or helium and the vertical axis is the logarithmic scale of the rate of growth ($\mu$m/min.).

A mixed gas of $Br_2$+$H_2$ or $Br_2$+He was used as the reaction gas and the bromine content was varied in the range of from 0.15 to 20%. The varying mixed gases were examined with respect to two temperatures, 1100° C. and 1200° C., of the source substrate 17. In the diagram, continuous lines represent the data obtained with a mixed gas of $Br_2$+$H_2$ and dotted lines represent that obtained with a mixed gas of $Br_2$+He From the test results shown in FIG. 12, it is noted that the rates of growth were higher and the magnitudes of dependency of the growth rate on the bromine content were greater when the mixed gas of $Br_2$+$H_2$ was used as compared with when the mixed gas of $Br_2$+He was used. The rates of growth were high when the temperature of the source substrate 17 was high.

In the test with the mixed gas of $Br_2$+$H_2$, the rate of growth at 1100° C. increased with increasing bromine content; it reached about 8 $\mu$m when the bromine content rose to about 8% and it remained practically constant thereafter. The rate of growth at 1200° C. increased with increasing bromine content; it reached a level in the approximate range of from 15 to 20 $\mu$m/min. when the bromine content rose to about 8% and remained practically constant thereafter.

In the test with the mixed gas of $Br_2$+He, the rate of growth at 1100° C. was practically constant in the neighborhood of 1.5 $\mu$m/min. when the bromine content exceeded about 1%. The rate of growth at 1200° C. reached a practically constant level of about 3 $\mu$m/min. when the bromine content exceeded about 1%.

Figure 13:
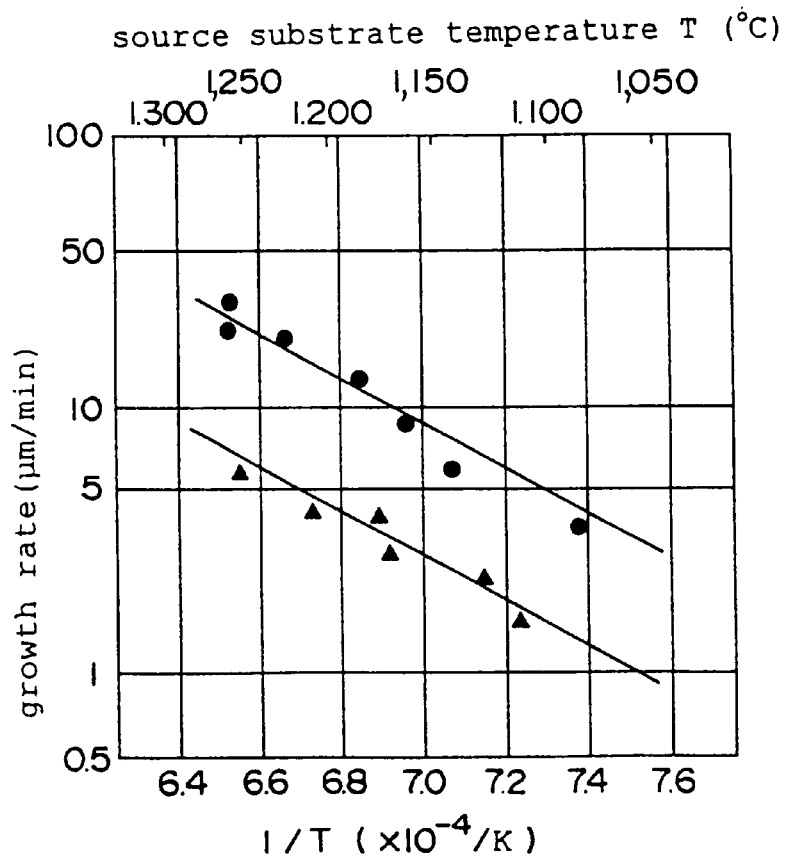
FIG. 13 is a graph of temperature of the substrate for growth and the rate of growth obtained by the method of this invention.

FIG. 13 is a graph showing the relationship between the growth temperature and the rate of growth. In the diagram, the horizontal axis is a linear scale of the temperature of the source substrate ($\times 10^{-4}$/K) and the vertical axis is the logarithmic scale of the rate of growth ($\mu$m/min.).

A mixed gas of $Br_2$+$H_2$ or $Br_2$+He was used as the gas and the temperature of the source substrate was varied in the range of from 1080° C. to 1250° C. The mixed gases were examined with respect to one hydrogen chloride/hydrogen content of 7% and one hydrogen chloride/helium content of 7%. In the diagram, a solid circular mark represents a mixed gas of $Br_2$+$H_2$ and a solid triangular mark a mixed gas of $Br_2$+He.

From the test results shown in FIG. 13, it is noted that, in the case of the mixed gas of $Br_2$+$H_2$, the rate of growth which was 2 $\mu$m/min. at 1120° C. increased with the increasing temperature and reached 6 $\mu$m/min. at 1250° C. In the case of the mixed gas of $Br_2$+He, the rate of growth which was about 4 $\mu$m/min. at 1080° C. increased with the increasing temperature and reached a level in the range of from 30 to 40 m/min at 1250° C.

Figure 14:
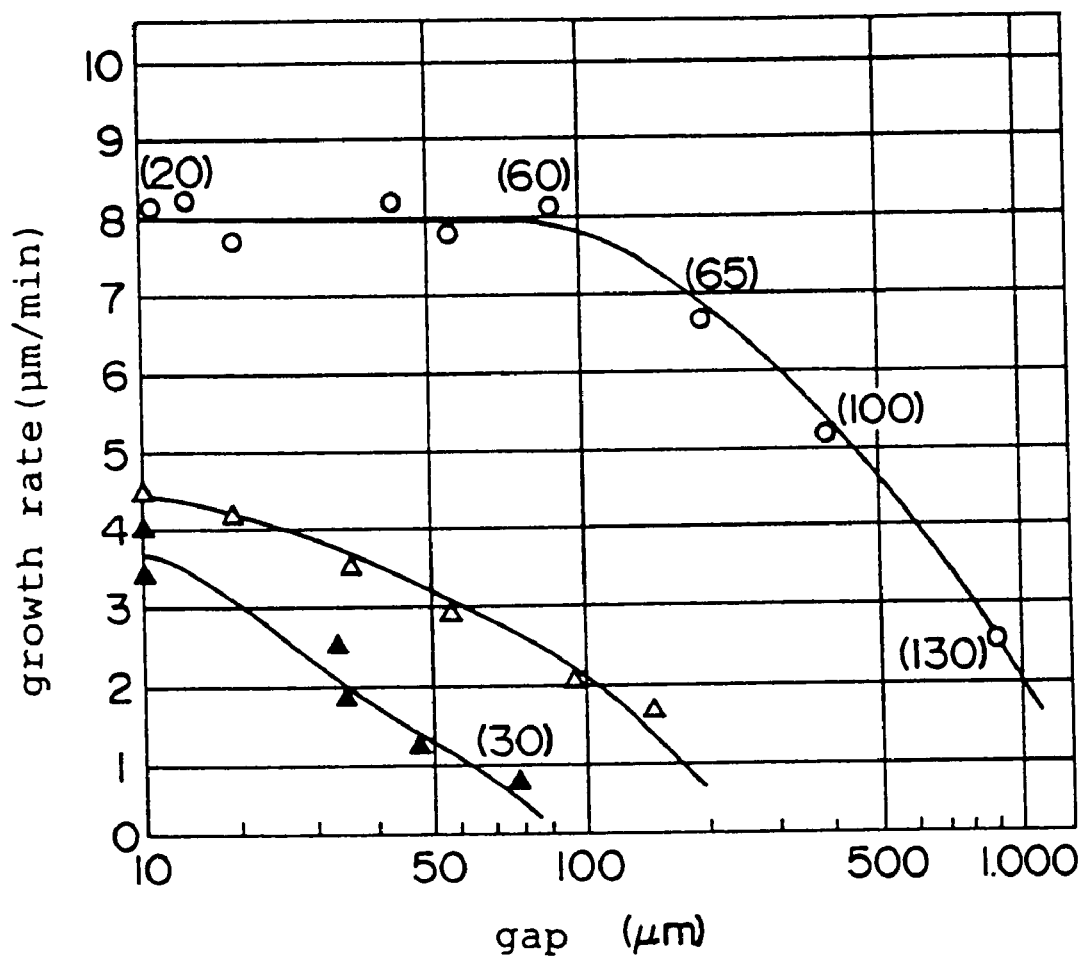
FIG. 14 is a graph of the gap separating the source substrate and the growth substrate from each other versus the rate of growth obtained by the method of this invention.

FIG. 14 is a characteristic diagram showing the relationship between the gap separating the two opposed substrates from each other and the rate of growth. In the diagram, the horizontal axis represents the logarithmic scale of the gap ($\mu$m) and the vertical axis represents the logarithmic scale of the rate of growth ($\mu$m/min.).

The gap was varied in the range of from 10 to 1000 $\mu$m. The examination was carried out with the kind of mixed gas, i.e. either HCl+$H_2$ or $Br_2$+$H_2$, and the temperature of the source substrate 17 used as the parameters varied. In the test, since the source substrate 17 alone was heated, there were times when the temperature difference between the source substrate 17 and the growth substrate 18 was not kept in the range of from 20 to 60° C.

In the diagram, an open circular mark represents a plot obtained in the test using the mixed gas of HCl+$H_2$ (HCl content 4%) and with the temperature of the source substrate 17 at 1260° C., an open triangular mark a plot obtained in the test using the mixed gas of HCl+$H_2$ (HCl content 3.8%) and with the temperature of the source substrate 17 at 1200° C., and a solid triangular mark a plot obtained in the test using the mixed gas of $Br_2$+$H_2$ (HCl content 3%) and with the temperature of the source substrate 17 at 1200° C.

From the test results shown in FIG. 14, it is noted that, in the case of the mixed gas of HCl+$H_2$ and the temperature of the growth substrate at 1260° C., the rate of growth remained at a practically constant level of about 8 $\mu$m/min when the gap was in the range of from 10 to 100 $\mu$m. The rate of growth gradually decreased thereafter with a widening gap. It reached about 2 $\mu$m/min. when the gap increased to 1000 $\mu$m.

In the case of the mixed gas of HCl+$H_2$ (HCl content 3.8%) and with the temperature of the source substrate 17 at 1200° C., the rate of growth gradually decreased in proportion as the gap widened. The rate of growth was about 4.5 $\mu$m/min. when the gap was about 10 $\mu$m and the rate of growth reached a level in the approximate range of 1 to 2 $\mu$m when the gap was about 150 $\mu$m.

Likewise in the case of the mixed gas of $Br_2$+$H_2$ (HCl content 3%) and with the temperature of the source substrate 17 at 1200° C., the rate of growth gradually decreased with the widening gap. The rate of growth was about 3 to 4 $\mu$m/min. when the gap was about 10 $\mu$m and the rate of growth was about 1 $\mu$m/min. when the gap was about 80 $\mu$m.

These data were obtained with the film formation carried out under normal pressure. They indicate that when the gap widened, the gas in motion caused a reaction and ceased to contribute to the formation of a film. When the formation of a film proceeded under a reduced pressure at which the mean free path of the gas molecules was elongated, no decrease of the rate of growth occurred with the gap still greater.

Figure 15:
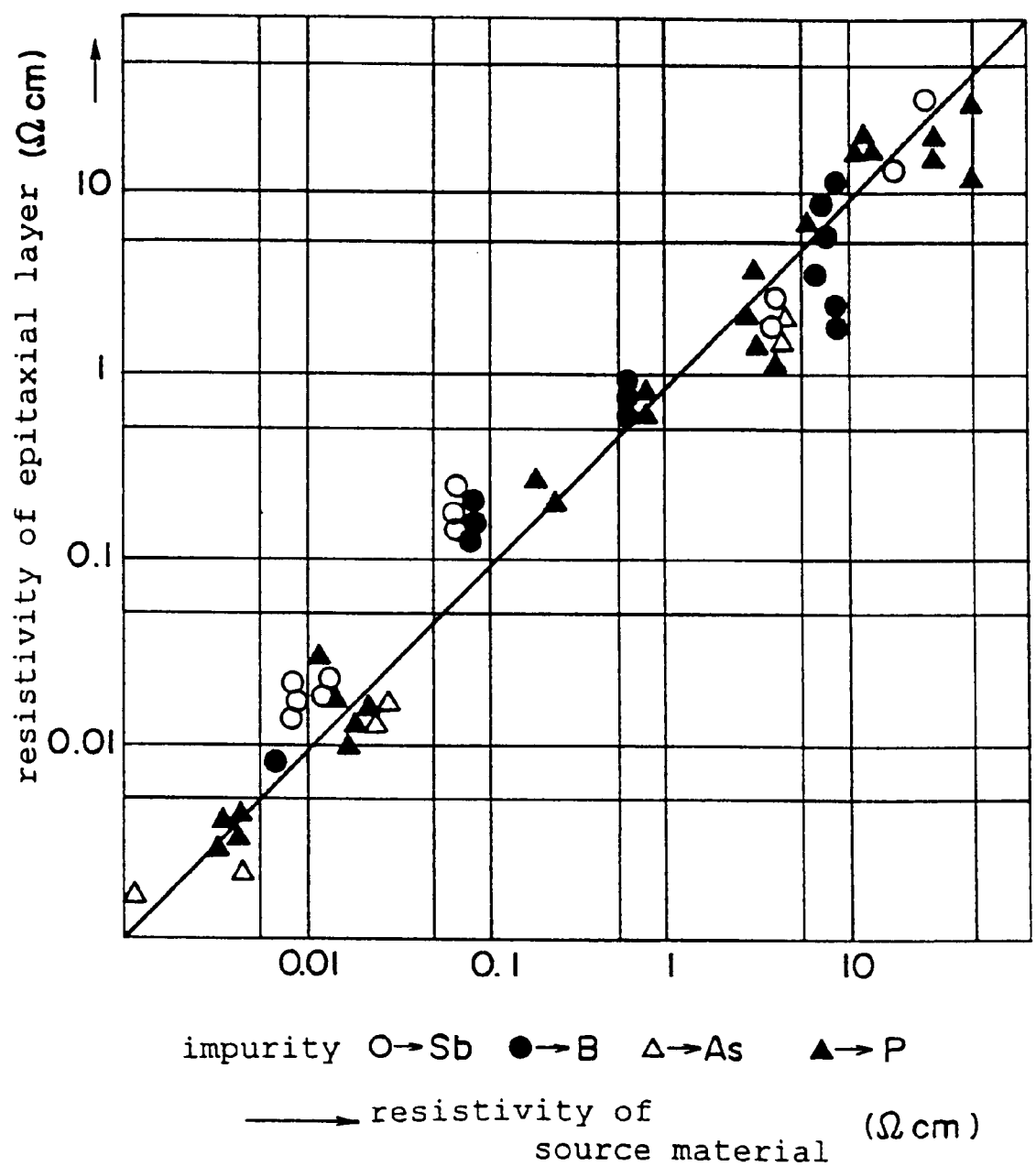
FIG. 15 is a graph of resistivity of the source substrate and the resistivity of the epitaxial layer formed on the growth substrate growth obtained by the method of this invention.

FIG. 15 is a graph showing the relationship between the resistivity of the source layer and that of the epitaxial layer. In the diagram, the horizontal axis is the logarithmic scale of the resistivity ($\Omega$cm) of the source substrate and the vertical axis is the logarithmic scale of the resistivity ($\Omega$cm) of the epitaxial layer.

The resistivity of the source substrate 17 was varied in the range of from 0.001 to 100 $\Omega$m. This test was conducted with the kind of dopant the varied parameter. In the diagram, an open circular mark represents a plot obtained in the test using antimony (Sb), a solid circular mark a plot obtained in the test using boron (B), an open triangular mark a plot obtained in the test using arsenic (As), and a solid triangular mark a plot obtained in the test using phosphorus (P), respectively, as a dopant.

The test results shown in FIG. 15 indicate that the magnitudes of resistivity of the two substrates had a ratio of about 1:1 irrespective of the kind of dopant. This fact implies that an epitaxial layer having near the desired resistivity will be obtained by using a source substrate having resistivity equalling the resistivity of the prospective epitaxial layer.

The apparatus for epitaxial growth according to this embodiment includes a source substrate holder provided with heating means, a holder for a growth substrate opposed thereto, and moving means for vertically moving at least either the source substrate holder or the holder for the growth substrate as described above.

By keeping the source substrate heated and vertically moving either the source substrate or the growth substrate, thereby adjusting the distance between the two substrates as in the method for epitaxial growth according to this embodiment, therefore, the growth substrate is heated to a temperature lower than the temperature of the source substrate and a prescribed temperature difference is established. This adjustment of temperature difference may be otherwise obtained by heating the growth substrate separately from the source substrate.

The film formation can be continuously performed on different growth substrates because the distance between the source substrate and the growth substrate and the temperature difference between the growth substrate and the source substrate can be easily adjusted as described above. Further, owing to the utilization of the heterogeneous reaction, the film formation can be expedited. As a result, the throughput of the apparatus can be improved and the adaptability of the method to mass production can be enhanced.

Further, after the interval between the source substrate and the growth substrate has been widened by the use of the vertically moving means mentioned above, to an extent short of inducing the heterogeneous reaction prior to the commencement of deposition of the reaction product, hydrogen is introduced through the hydrogen gas inlet for the treatment of the growth substrate. As a result, the film formation can be performed on a clean surface and the film can be formed with improved quality.

Further, by providing heating means for the growth substrate holder, thereby enabling the growth substrate to be directly heated, the uniformity of temperature of the substrate is enhanced. In addition, the method is not affected by factors such as the shape of reactor and the flow rate of gas because it operates with the heterogeneous reaction at the opposed surfaces of the two substrates. As a result, it contributes to improvement of the uniformity of film thickness and film quality and allows an increase in the diameter of wafers to be manufactured.

Further, the apparatus is capable of forming a film at a high rate and obtaining a fully satisfactory throughput even in the sheet feed type operation and consequently affording a saving in the energy consumption. Moreover, it contributes to lower the cost of production because it is not required to use hydrogen gas in a large amount.

Besides, the apparatus is safe because it uses a gas containing chlorine, bromine, iodine, hydrogen chloride, hydrogen bromide, or hydrogen iodide as the reaction gas.

Figure 16:
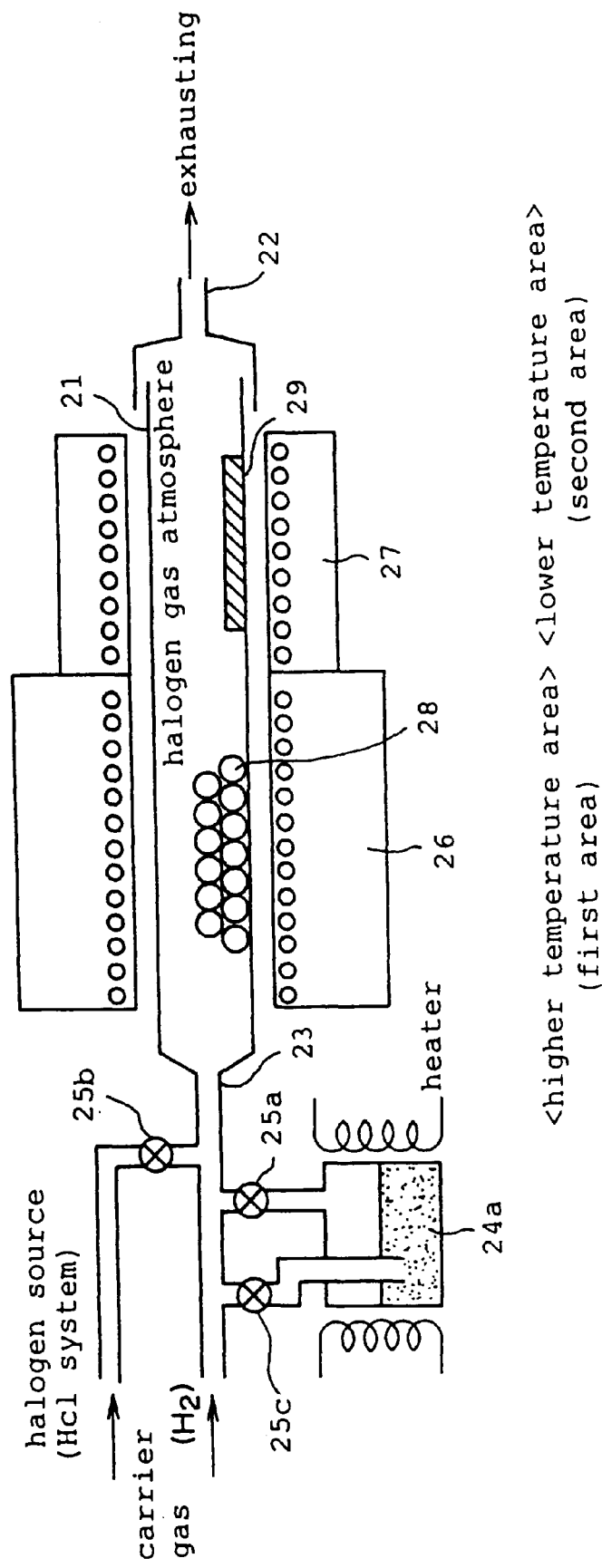
FIG. 16 is a schematic diagram of an apparatus for epitaxial growth according to the sixth embodiment of this invention.

(3) Apparatus for Epitaxial Growth and Method for Epitaxial Growth According to the Sixth Embodiment of This Invention FIG. 16 is a schematic diagram of an apparatus to be used for implementing a method for epitaxial growth according to the sixth embodiment of this invention. This apparatus, unlike the apparatuses for epitaxial growth according to the first through the fourth embodiments, uses a horizontal chamber 21 as a film-forming enclosure. As a source material 28, a film-forming material of the shape of a block, unlike the shape of a growth substrate 29, is used. The source material 18 and the growth substrate 29 are not opposed to each other and they are set at different planar positions inside the same chamber 21.

As illustrated in the diagram, the film-forming chamber 21 is adapted to have its operating internal pressure reduced through the gas outlet 22 and is a so-called horizontal chamber having a wide horizontal area. On the side opposite the gas outlet 22 is an inlet 23 for introducing a reaction gas. To the gas inlet 23, a halogen source 24*a* for supplying iodine, for example, is connected through a cock 25*a*. Through this gas inlet 23, a HCl type halogen gas is introduced via the cock 25*b* into the chamber 21 as illustrated in the diagram. Besides, a carrier gas such as $H_2$ is also introduced into the chamber 21. In the present embodiment, a reaction gas source 24 in the form of solid or liquid iodine is adapted to generate iodine gas by heating the solid or liquid iodine with a heater. A cock 25*c* allows introduction of the hydrogen gas into the halogen source 24*a*.

Figure 17:
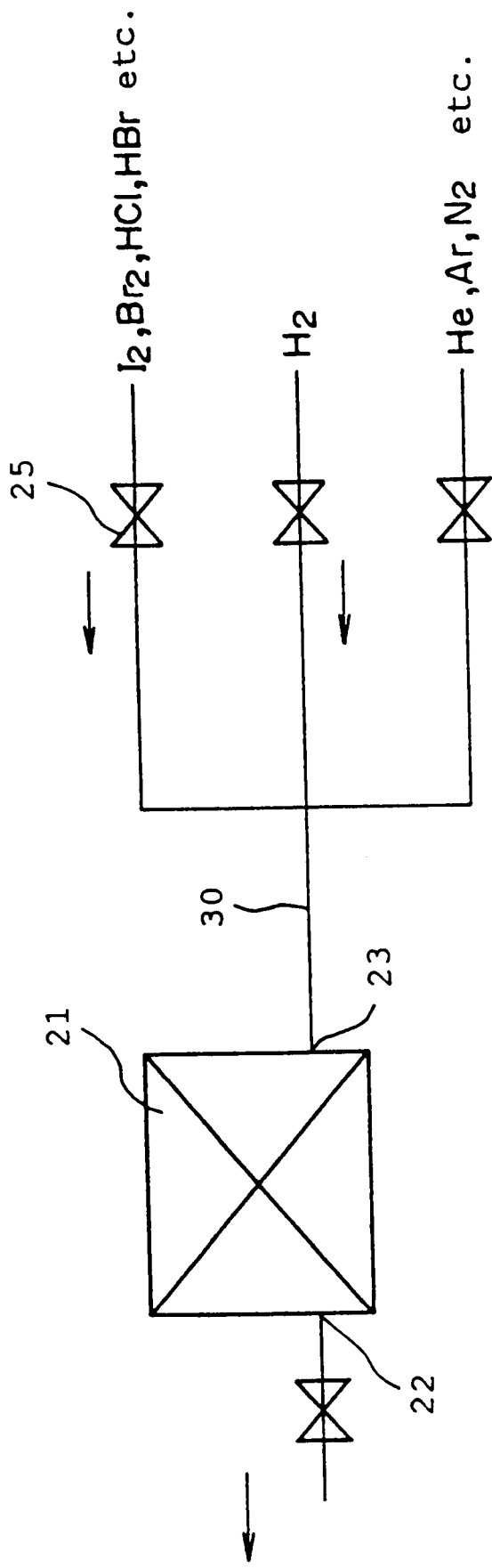
FIG. 17 is an explanatory diagram illustrating connection of reaction gas lines in the method for growth according to the sixth embodiment of this invention.

The film-forming chamber 21 is divided into two regions, i.e. a high-temperature region (the first region) and a low-temperature region (the second region). First and second heating means 26 and 27 for controlling temperature are attached to the outer shell of the chamber 21 at positions corresponding to the low-temperature region and the high-temperature region, respectively. The first heating means 26 can be set at a higher temperature than the second heating means 27. The silicon source 28 in the shape of a block is disposed in the area inside the chamber 21 defined by the first heating means 26, namely in the high-temperature region and the silicon wafer 29 which is the growth substrate is disposed in the low-temperature region. For the first and the second heating means, such high-frequency heating means as shown in the diagram, resistance heating means, or lamp heating means may be used. A single silicon wafer 29 may be installed or as many silicon wafers 29 as are necessary may be installed. The wafer to be disposed in the second area may be of the type having a large diameter such as, for example, 200 mm. FIG. 17 is a diagram illustrating connection of reaction gas feed piping and the apparatus for growth shown in FIG. 16. A gas pipe 30 for introduction of a halogen gas like iodine as the reaction gas, hydrogen gas for a pretreatment, and an inert gas like helium as a carrier gas is connected to the gas inlet 23 as shown in the diagram.

The method for epitaxial growth according to one embodiment of this invention by the use of the apparatus shown in FIG. 16 will now be described below. This embodiment represents a case using silicon as a source material and forming an epitaxially grown film of silicon on a wafer of silicon.

Figure 18:
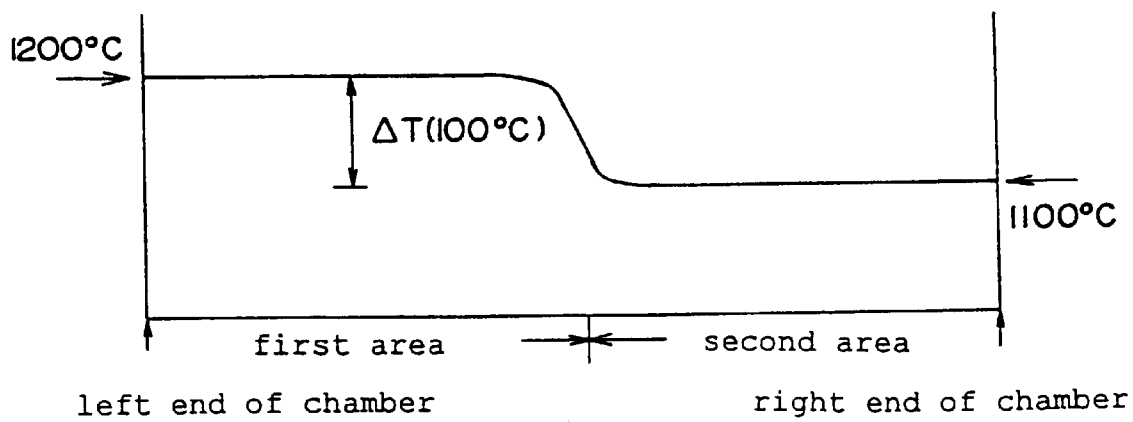
FIG. 18 is a graph of temperature distribution in the film-forming chamber in the method for growth according to the six embodiment of this invention.

First, the silicon block 28 is disposed as a source material in the first area and the silicon wafer 29 is disposed in the second area, respectively, inside the chamber 21. Thereafter, the chamber 21 is evacuated by means of evacuating means (not shown) connected to the gas outlet 22 and the interior of the chamber 21 is heated with the first and the second heading means 26 and 27 and meanwhile the cock connected to the hydrogen gas source is opened to commence the introduction of hydrogen gas into the chamber 21 and effect the pretreatment for removing the natural oxide film from the silicon wafer 29. Then, another cock is opened to introduce the reaction gas such as, for example, iodine gas into the chamber 21. At this time, the interior of the chamber 21 is heated by the first and the second heating means 26, 27 so as to maintain such a temperature distribution as shown in FIG. 18. In the diagram of FIG. 18, the horizontal axis represents the scale of distance in the direction of length of the chamber 21. To be specific, the left end of the graph corresponds to the left end of the chamber 21 and the right end thereof to the right end of the chamber 21. As shown in the diagram, the first area in which the silicon source 28 is disposed is kept at 1200° C. by the first heating means 26 and the second area in which the silicon wafer 29 is disposed is kept at 1100° C. by the second heating means 27, so as to establish a temperature difference of 100° C. between the two areas.

Figure 19:
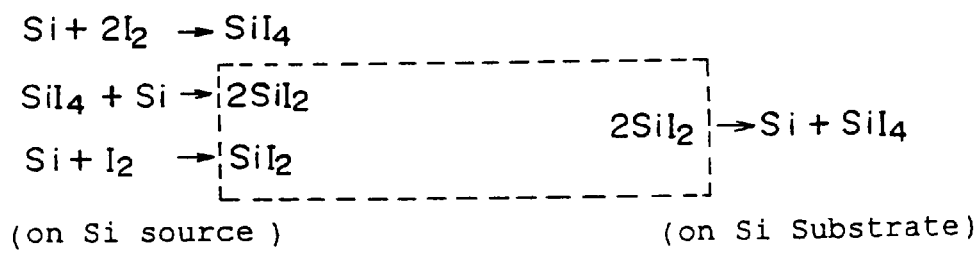
FIG. 19 is an explanatory diagram showing the film-forming reactions in the method for growth according to the sixth embodiment of this invention.

Incidentally, the reaction gas such as iodine gas is introduced into the chamber 21 either alone or in combination with an inert gas such as hydrogen gas or helium, for example. The iodine gas and the silicon as the source material induce a heterogeneous reaction which proceeds through a process such as is shown in FIG. 19 to separate silicon from the silicon wafer 29 and form a film by epitaxial growth on the wafer 29. This heterogeneous reaction will be explained below with reference to FIG. 19. First, silicon and the iodine gas react with each other on the silicon source kept at an elevated temperature to form silicon iodide. This silicon iodide separates from the silicon wafer side which is kept at a lower temperature than the silicon source, with the result that silicon is deposited on the silicon wafer 29 to effect the formation of a film of epitaxial growth.

The temperatures at which the source material 28 and the silicon wafer 29 are kept by heating and the temperature differences therebetween do not need to be set at the particular magnitudes indicated in FIG. 18 but may be set to best suit the occasion, depending on the speed of epitaxial growth desired or the combination of gases to be used. As the reaction gas, a halogen or halide gas such as, for example, chlorine, bromine, iodine, hydrogen chloride, hydrogen bromide, or hydrogen iodide can be used. Besides, silicon tetrachloride ($SiCl_4$) trichloro-silane ($SiHCl_3$), or dichlorosilane ($SiH_2Cl_2$) may be used as occasion demands. It is also permissible to use a combination of hydrogen gas with a halogen gas such as, for example, $H_2/I_2$, $H_2/Br_2$, $H_2/HCl$, $H_2/SiCl_4$ or $H_2/SiHCl_4$ or a combination of an inert gas with a halogen gas such as, for example, $He/I_2$, $He/Br_2$, $He/HCl$, or $He/SiCl_4$.

The embodiment described above represents a case of using silicon as the material both for the source and for the substrate for growth. Needless to say, the method of this invention can be applied even when germanium or a compound semiconductor is used as the material for the source and the growth substrate. It is also permissible to form the source and the growth substrate with different materials and allow a film of different materials to grow on the growth substrate. While the method has been described as using the halogen gas in a form diluted with an inert gas such as hydrogen gas or helium, it is also permissible to use a 100% halogen gas or hydrogen halide gas which is not diluted with such a gas as mentioned above. As the inert gas, argon or nitrogen gas may be used instead.

Further, the halogen gas may have been derived by heating a solid or a liquid source as shown in FIG. 16. The pretreatment with hydrogen and the growth of an epitaxial film may be carried out under a reduced pressure or under normal pressure. A vapor treatment with hydrofluoric acid may be used in the place of the pretreatment with hydrogen gas.

FIGS. 20A and 20B are a front view and a side view to aid in the explanation of the method for disposing a plurality of silicon wafers in the low-temperature part of the chamber 21. The plural silicon wafers 29 are set flat relative to the chamber 21 as shown in FIG. 20A or set upright as shown in FIG. 20B. The lefthand halves of FIGS. 20A and 20B are front views of the chamber and the righthand halves thereof are side views of the chamber.

The relationship between the resistivity of the silicon source and the resistivity of the epitaxial film formed on the silicon wafer is nearly as shown in FIG. 15. It is clearly noted from this diagram that the magnitude of resistivity of the material used for the source is retained intact in the epitaxial film. Specifically, such impurities as P, B, As, and Sb are entrained together with silicon by the halogen gas in the course of mass transfer into the epitaxial film. For the purpose of obtaining an epitaxial film having a certain magnitude of resistivity, therefore, it suffices to prepare a block of silicon having a conforming magnitude of resistivity. No special control by means of doping is necessary.

By the method for epitaxial growth and the apparatus for epitaxial growth according to the sixth embodiment of this invention, the source material and the growth substrate are disposed in the first and second areas horizontally separated inside the film-forming chamber and they are heated independently of each other so as to produce a prescribed temperature difference between themselves and, with the chamber and its interior in the state ensuing on the heating mentioned above, the prescribed reaction gas is introduced into the chamber to induce the heterogeneous reaction and effect the formation of a film by epitaxial growth on the growth substrate as described above.

The sixth embodiment of this invention, therefore, does not need to strictly control the positional relationship between the source material and the growth substrate, unlike the conventional method and apparatus which produce a heterogeneous reaction by having a source material and a growth substrate disposed vertically opposed to each other and accurately controlling the gap therebetween. Incidentally, in the method and apparatus for epitaxial growth according to the sixth embodiment of this invention, the source material and the growth substrate have only to be disposed in the first and the second area of the chamber with no special consideration paid to the distance therebetween.

When the first round of epitaxial growth is completed and the second round of epitaxial growth is prepared by having a new growth substrate set in place in the chamber, the process for manufacture is greatly simplified and is adapted to mass production because the source material used in the first cycle of epitaxial growth can be used as is in the second cycle. Further, they permit use of the source material in the shape of a block. Silicon block and germanium block are concrete examples of the source material usable herein. Thus, the source material can be selected from among a wide variety of substances. In addition, since the surface area of the growth substrate is not restricted to the surface area of the source material, the epitaxial growth may be collectively performed on a plurality of wafers disposed in the second area or it may be performed easily on a wafer of a large diameter.

This invention, as demonstrated by the embodiments described above, provides a method and an apparatus which excel in adaptability to mass production and in practical utility and are highly effective in lowering the cost of production of an epitaxial film.

What is claimed is:

1. An apparatus for epitaxial growth of a crystal on a first planar surface of a growth substrate, said apparatus comprising:

a closed chamber;

a source substrate holder disposed inside said closed chamber for holding a source substrate;

a growth substrate holder for holding a growth substrate, with a first planar surface of the growth substrate facing and parallel to a second planar surface on the source substrate, to define a gap between the first and second planar surfaces;

heating means disposed within said source substrate holder;

means for introducing a reaction gas into the gap;

linear moving means for moving at least one of said substrates, in a linear direction, during deposition of a reaction product on said growth substrate, to adjust said gap; and planar moving means for moving at least one of said substrates, during deposition of the reaction product on said growth substrate, to provide planar relative movement between the first and second planar surfaces, said planar relative movement being perpendicular to said linear direction, whereby every point on said second planar surface is brought into confrontation with said first planar surface.

2. The apparatus according to claim 1 additionally comprising:

heating means disposed within said growth substrate holder.

3. The apparatus according to claim 1 wherein said linear moving means is responsive to temperature difference between said substrates to adjust the gap between the first and second planar surfaces for maintaining a predetermined temperature differential.

4. The apparatus according to claim 1, additionally comprising a gas exhaust device connected to said chamber for lowering the internal pressure of said chamber.

5. The apparatus according to claim 2, additionally comprising a gas exhaust device connected to said chamber for lowering the internal pressure of said chamber.

* * * * *